(12) United States Patent
Ball

(10) Patent No.: US 6,267,287 B1
(45) Date of Patent: Jul. 31, 2001

(54) APPARATUS AND METHOD OF CLAMPING SEMICONDUCTOR DEVICES USING SLIDING FINGER SUPPORTS

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/358,309

(22) Filed: Jul. 21, 1999

Related U.S. Application Data

(62) Division of application No. 09/244,702, filed on Feb. 4, 1999, which is a continuation of application No. 08/709,639, filed on Sep. 9, 1996, now Pat. No. 5,890,644, which is a continuation-in-part of application No. 08/631,143, filed on Jun. 7, 1996, now Pat. No. 5,673,845, and a continuation-in-part of application No. 08/597,616, filed on Feb. 6, 1996, now Pat. No. 5,647,528, and a continuation-in-part of application No. 08/592,058, filed on Jan. 26, 1996, now Pat. No. 5,954,842.

(51) Int. Cl.[7] .................................................. B23K 37/04
(52) U.S. Cl. ........................ 228/44.7; 228/4.5; 228/180.5
(58) Field of Search .............................. 228/4.5, 180.5, 228/212, 213, 44.7

(56) References Cited

U.S. PATENT DOCUMENTS

| | | | |
|---|---|---|---|
| 3,685,137 | * | 8/1972 | Gardiner .............................. 29/471.3 |
| 3,868,764 | * | 3/1975 | Hartleroad et al. ..................... 29/589 |
| 3,995,845 | | 12/1976 | Scheffer . |
| 4,177,554 | * | 12/1979 | Deveres et al. ......................... 29/626 |
| 4,583,676 | * | 4/1986 | Pena et al. ........................... 228/179 |
| 4,600,138 | | 7/1986 | Hill . |
| 4,603,803 | | 8/1986 | Chan et al. . |
| 4,653,681 | | 3/1987 | Dreibelbis et al. . |
| 4,765,531 | | 8/1988 | Ricketson et al. . |
| 4,821,945 | | 4/1989 | Chase et al. . |
| 4,958,762 | | 9/1990 | Shimizu et al. . |
| 4,978,393 | | 12/1990 | Maheas . |
| 4,978,835 | | 12/1990 | Luijtjes et al. . |
| 5,035,034 | | 7/1991 | Cotney . |
| 5,062,565 | | 11/1991 | Wood et al. . |
| 5,082,165 | | 1/1992 | Ishizuka . |
| 5,116,031 | * | 5/1992 | Takeuchi et al. .................... 269/87.3 |
| 5,181,646 | | 1/1993 | Ushiki et al. . |
| 5,193,733 | | 3/1993 | You . |
| 5,238,174 | | 8/1993 | Ricketson et al. . |
| 5,264,002 | | 11/1993 | Egashira et al. . |
| 5,277,356 | | 1/1994 | Kawauchi . |
| 5,281,794 | | 1/1994 | Uehara et al. . |
| 5,307,977 | | 5/1994 | Park . |
| 5,307,978 | | 5/1994 | Ricketson et al. . |
| 5,322,207 | | 6/1994 | Fogal et al. . |

(List continued on next page.)

FOREIGN PATENT DOCUMENTS

407302806A * 11/1995 (JP) .

OTHER PUBLICATIONS

"Ultrasonic or Thermosonic Wire Bond Site Stabilization Clamp," Research Disclosure, Jun. 1986, No. 26622.

*Primary Examiner*—Patrick Ryan
*Assistant Examiner*—Kiley Stoner
(74) *Attorney, Agent, or Firm*—TraskBritt

(57) ABSTRACT

An apparatus and method of supporting lead fingers during a wire bonding process and of preventing the bonding apparatus and clamping assembly from applying force against the die. The present invention includes the use of a movable arm with a portion that is positionable under a portion of the lead fingers of a lead frame during the wire bonding process to provide increased stability of the lead fingers and prevent the bonding apparatus and clamping assembly from applying force against the die. The present invention also provides for the transfer of heat from the heat block directly to the lead fingers during the wire bonding process. The present invention includes the use of a clamp for stabilizing lead fingers during the wire bonding process.

21 Claims, 30 Drawing Sheets

U.S. PATENT DOCUMENTS

| | | | |
|---|---|---|---|
| 5,332,405 | * | 7/1994 | Golomb ............................. 29/25.01 |
| 5,367,253 | | 11/1994 | Wood et al. . |
| 5,372,972 | | 12/1994 | Hayashi et al. . |
| 5,425,491 | | 6/1995 | Tanaka et al. . |
| 5,558,267 | | 9/1996 | Humphrey et al. . |
| 5,611,478 | * | 3/1997 | Asanasavest ...................... 228/110.1 |
| 5,647,528 | * | 7/1997 | Ball et al. ......................... 228/180.5 |
| 5,660,318 | | 8/1997 | Jung et al. . |
| 5,673,845 | | 10/1997 | Ball . |
| 5,770,479 | * | 6/1998 | Brooks et al. ....................... 438/123 |
| 5,796,161 | * | 8/1998 | Moon .................................... 257/676 |
| 5,890,644 | | 4/1999 | Ball . |
| 5,904,288 | * | 5/1999 | Humphrey ........................ 228/180.5 |
| 5,954,842 | * | 9/1999 | Fogal et al. ......................... 29/25.01 |
| 6,000,599 | * | 12/1999 | Ball et al. ......................... 228/180.5 |
| 6,047,468 | * | 4/2000 | Fogal et al. ............................ 29/827 |
| 6,047,877 | * | 4/2000 | Ball .................................. 228/180.5 |
| 6,062,459 | * | 5/2000 | Sabyeying ............................. 228/4.5 |
| 6,068,174 | | 5/2000 | Ball et al. . |

\* cited by examiner

APPARATUS AND METHOD OF CLAMPING SEMICONDUCTOR DEVICES USING SLIDING FINGER SUPPORTS

CROSS REFERENCE TO RELATED APPLICATION

This application is a divisional of U.S. patent application Ser. No. 09/244,702, filed Feb. 4, 1999, pending; which is a continuation of U.S. patent application Ser. No. 08/709,639, filed Sep. 9, 1996, now U.S. patent No. 5,890,644, issued Apr. 6, 1999; which is a continuation-in-part of U.S. patent application Ser. No. 08/631,143, filed Jun. 7, 1996, now U.S. patent No. 5,673,845, issued Oct. 7, 1997; U.S. Pat. application Ser. No. 08/597,616, filed Feb. 6, 1996, now U.S. Pat. No. 5,647,528, issued Jul. 15, 1997; and U.S. Pat. application Ser. No. 08/592,058, filed Jan. 26, 1996, now U.S. Pat. No. 5,954,842, issued Sep. 21, 1999.

BACKGROUND OF THE INVENTION

1. Field of the Invention

The present invention is related to forming wire bonds between the contact pads on semiconductor devices and individual lead frame fingers of a lead frame.

More specifically, the present invention is related to the apparatus and method of supporting the lead fingers of a lead frame during a wire bonding process using a support arm with a lead support portion that is positionable between the lead fingers and the die prior to the bonding process to help substantially stabilize the lead fingers during the bonding process.

2. State of the Art

Well known types of semiconductor devices are connected to lead frames and subsequently encapsulated in plastic for use in a wide variety of applications. Typically, the lead frame is formed from a single continuous sheet of metal by metal stamping operations. In a conventional lead frame, the lead frame includes an outer supporting frame, a central semiconductor chip supporting pad and a plurality of lead fingers, each lead finger having, in turn, a bonding portion thereof near the central chip supporting pad. Ultimately, the outer supporting frame of the lead frame is removed after the wire bonds between the contact pads of the semiconductor chip device and the lead fingers are made and the semiconductor device and a portion of the lead frame have been encapsulated.

In the assembly of semiconductor devices utilizing such conventional lead frames, a semiconductor die is secured to the central supporting pad (such as by a solder or epoxy die-attach, although a double-sided adhesive tape-type attach has also been suggested in the art) and then the entire lead frame, with the semiconductor die thereon, is placed into a wire bonding apparatus including a clamp assembly for holding the lead frame and die assembly, and clamping the lead fingers for bonding.

In contrast to a conventional lead frame, U.S. Pat. No. 4,862,245 issued Aug. 29, 1989 to Pashby et al. illustrates a so-called "leads over chip" arrangement ("LOC") on the semiconductor die. A plurality of lead fingers of the lead frame extends over the active surface of a semiconductor die toward a line of bond pads thereon wherein bond wires make the electrical connection between the lead fingers and the bond pads. An alpha barrier such as a polyamide tape (for example, Kapton™ tape) is adhered between the semiconductor die and the lead fingers. This configuration, which eliminates the use of the previously-referenced central die attach pad, may assist in limiting the ingress of corrosive environment contaminants after encapsulation of the semiconductor device, achieve a larger portion of the lead finger path length encapsulated in the packaging material, and reduce electrical resistance caused by the length of the bond wires (i.e. the longer the bond wire, the higher the resistance) and potential wire sweep problems in the encapsulation of the semiconductor device aggravated by long wire loops.

In a standard wire bonding process, the bond wires are attached, one at a time, from each bond pad on the semiconductor device to a corresponding lead finger. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

To form a good bond during the wire bonding processing, it is preferable to perform the bonding at an elevated and somewhat stable temperature. Therefore, as noted above, the lead frame assembly including the attached semiconductor die is generally placed on a heater block. The semiconductor die is then clamped (via the lead frame) to the heater block by a clamping assembly. With a conventional lead frame, the lead fingers are clamped directly against the underlying heater block. Whereas, in an LOC lead frame, the lead fingers are biased between the clamp and the active surface of the semiconductor die heater block. Thus, in an LOC lead frame arrangement, the clamping assembly and bonding apparatus apply pressure against the die thereby causing possible damage. In addition, heating of the lead fingers in an LOC lead frame for wire bonding must be done through heating the die as apposed to directly heating the lead fingers by the heater block in a conventional lead frame.

Therefore, in an LOC lead frame configuration it would be advantageous to develop an apparatus to prevent the clamping assembly and bonding apparatus from applying force against the die. In addition, it would be advantageous to develop an apparatus for transferring heat directly from the heat block to the lead fingers.

In an LOC structure, the Kapton™ tape comprising the alpha barrier or dielectric between the semiconductor and the lead fingers becomes soft at the elevated temperature. The softening of the tapes allows the lead fingers and/or semiconductor die to move in response to ultrasonic energy or pressure (force) exerted by the wire bonding head (capillary). As a result, the mechanical integrity of the wire bond to the lead fingers is diminished. Furthermore, a "bouncing" motion is imparted to the lead fingers by the wire bonding head movement, which motion may be exacerbated by the heat softened tape. This bouncing motion can also result in poor wire bonds which subsequently fail.

Thus, die fabricators are somewhat compelled to select the die attach compound (or other means) and alpha barrier tape based on the thermal stability of the materials rather than on the basis of the most effective material for a given application.

Therefore, it would be advantageous to develop an apparatus that would replace the alpha barrier tape while stabilizing the semiconductor die and the lead fingers during the wire bonding process.

Typical apparatus and methods for clamping the lead frame during the wire bonding process or for clamping and advancing the lead frame are illustrated in U.S. Pat. Nos. 4,765,531, 5,082,165, 5,238,174, 5,264,002, 5,307,978, 5,322,207, and 5,372,972. However, such apparatus and methods do not address the problem of supporting the lead fingers during the wire bonding process or preventing the application of force on the die.

Such prior art apparatus and methods have been directed at advancing and orienting the lead frame but have not attempted to solve the problems of forming reliable wire bonds between the contact pads of semiconductor devices and lead fingers of lead frames.

There have been other attempts to overcome the problem of the bouncing motion imparted to the lead fingers by the wire bonding head movement. For example, for bonding LOC structures, rigid clamping plates having bond site windows therein have been reconfigured so that the bond site window is reduced in size and the downwardly-extending lip or periphery contacts the lead fingers extending over the die and clamps the lead fingers directly thereto. However, the rigid clamp has been found to be too rigid and unyielding for use with an LOC configuration, and may possibly damage the die. Moreover, the use of a rigid clamp adds to the force exerted against the die and does nothing to prevent the application of force by the bonding apparatus.

The present invention is directed to an improved wire bonding apparatus and method for forming such wire bonds.

SUMMARY OF THE INVENTION

The present invention is related to the apparatus and method of supporting lead fingers during a wire bonding process. The present invention includes the use of a movable arm having a lead support portion for positioning under the lead fingers of a lead frame and/or between the die and the lead fingers during the bonding process to provide increased stability of the individual lead finger for improved bonding and to prevent the bonding apparatus and clamping assembly from applying force to the die. The present invention also provides for heat to be directly transferred from the heat block to the lead fingers during the wire bonding process.

BRIEF DESCRIPTION OF THE SEVERAL VIEWS OF THE DRAWINGS

The present invention will be better understood when the description of the invention is taken in conjunction with the drawings wherein.

DETAILED DESCRIPTION OF THE INVENTION

Figure 1:
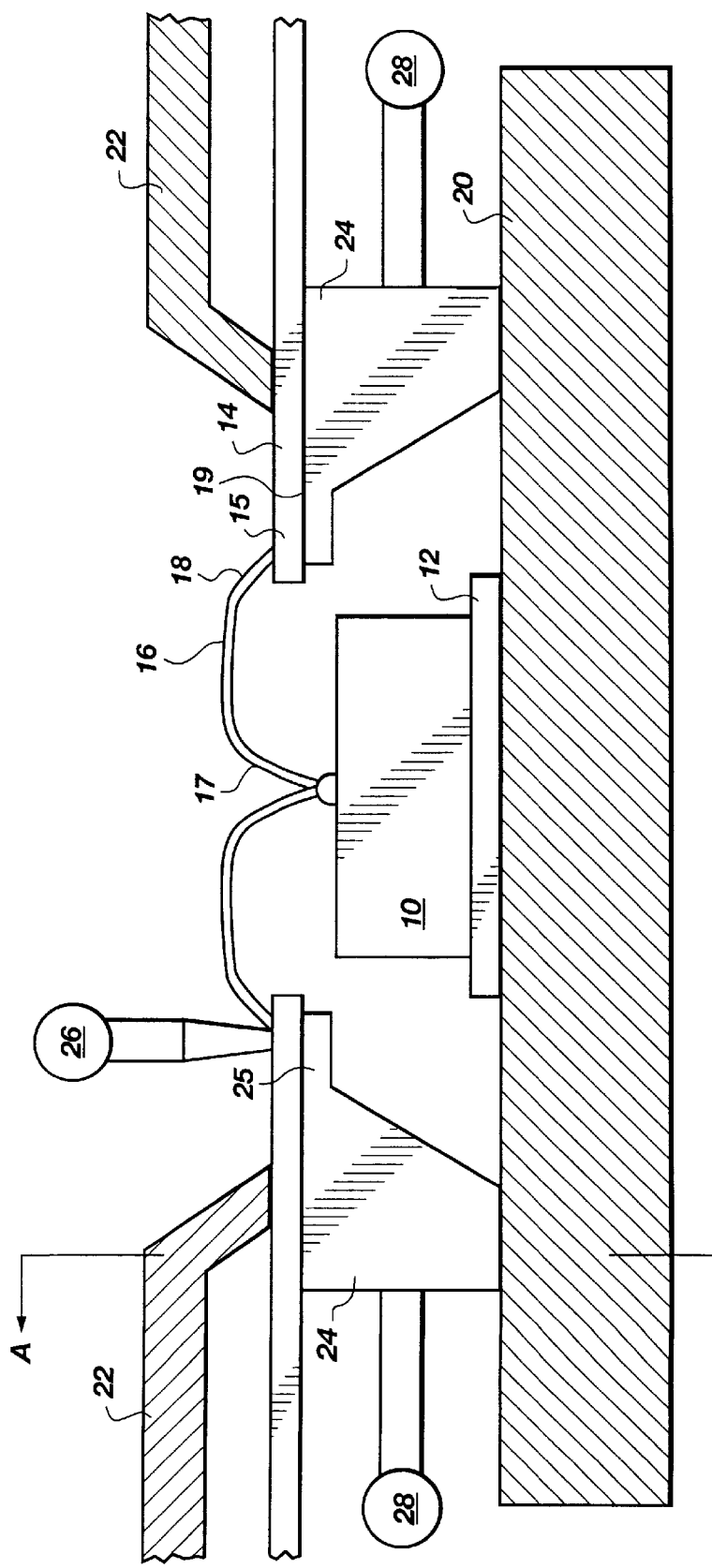
FIG. 1 is a side view of the present invention used in the wire bonding of a semiconductor device arrangement having a conventional lead frame.

Referring to drawing FIG. 1, a semiconductor device (die) 10 is shown being supported by the paddle 12 of a conventional lead frame. A heat block 20 is used to heat the paddle 12 and die 10 during the wire bonding process. As shown, a suitable wire 16 has one end thereof 17 bonded to a bond pad of the die 10. The wire 16 may be of any suitable type for connection and bonding purposes, such as gold, gold alloy, aluminum, aluminum alloy, etc. The other end 18 of the wire 16 is shown being bonded to the end 15 of a lead finger 14 of the lead frame by a suitable bonding apparatus 26. The bonding apparatus 26 may be of any suitable type well known in the bonding area, such as a tailless thermosonic or ultrasonic capillary type bonding apparatus which dispenses wire during the bonding process. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. Further shown in drawing FIG. 1 is a movable and/or adjustable arm 24 having a lead support portion 25 attached to or an integral part of the movable and/or adjustable arm 24. The movable and/or adjustable arm 24 is dynamically attached to the heat block 20 so that the lead support portion 25 can be positioned between the die 10 and the lead fingers 14. The movable and/or adjustable arm 24 and lead support portion 25 thus allow for any desired size semiconductor device 10 to be wire bonded without a change to the heat block 20. In addition, movable and/or adjustable arm 24 having lead support portion 25 conducts heat from the heat block 20 to the lead fingers 14.

During the wire bonding process, it is desirable for the heat block to be heated to substantially 230 degrees Centigrade. Although the heat block may be any suitable temperature during the bonding operation, the block 20 temperature should not exceed 300 degrees Centigrade to prevent thermal damage to the die 10. It is further preferred that the bond of the end 18 of the wire 16 made to the end 15 of the lead finger 14 of a conventional lead frame be made at a temperature of substantially 190 degrees Centigrade for bonding effectiveness. It is also preferred that the bonding apparatus exert a bonding force of substantially 50 to 100 grams when bonding the end 18 of the wire 16 to the end 15 of lead finger 14 for effective bond formation of the wire 16 to lead finger 14.

The movement of the movable arm 24 may be effectuated by various means 28. Such means are well known in the manufacturing area and may include an air cylinder, a solenoid, a magnet system, a motor, sprockets, a cable and pulley system, a lead screw, a cam arrangement, etc.

The movable arm 24 is dynamically attached to the heat block 20 so that as the heat block moves into position during the wire bonding process. The movable arm 24 having lead support portion 25 moves into position under the lead fingers 14. Still referring to FIG. 1, movable and/or adjustable arm 24 is shown as traveling against the heat block 20 such that the direction of travel is substantially parallel with respect to the lower surface 19 of the lead fingers 14 of a conventional lead frame.

Figure 2:
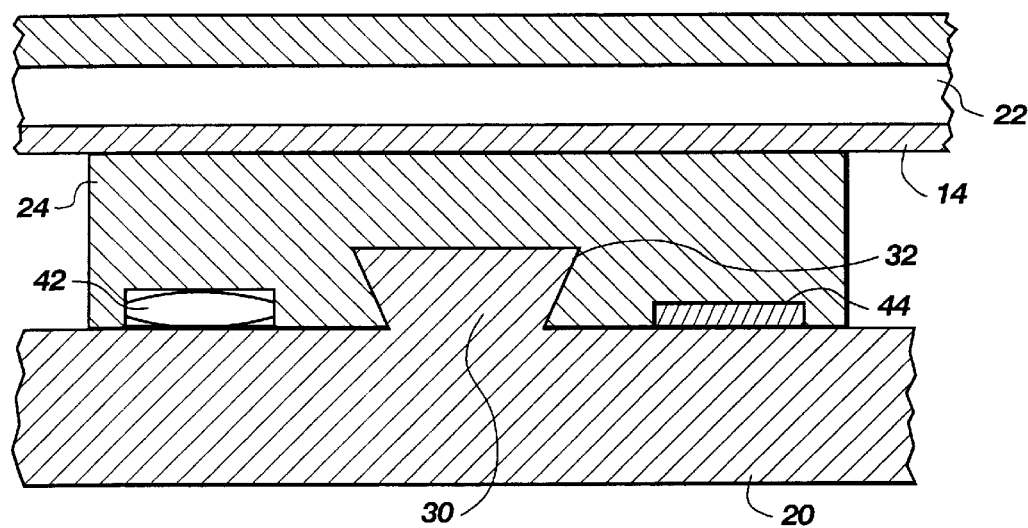
FIG. 2 is a cross-sectional view taken along A—A of the present invention as depicted in FIG. 1 and further shows one method of dynamic attachment.

Referring to drawing FIG. 2, one method for dynamically attaching movable arm 24 to heat block 20 is by a tongue-and-groove type connection. A tongue 30 shaped in the form of a dove tail is formed in the heat block 20. A mating groove 32 is formed in movable arm 24 so that the tongue 30 may slide within the groove. Thus, movable arm 24 is allowed to slide with respect to heat block 20 while maintaining contact with the heat block for efficient heat transfer. Alternatively, a tongue could be formed in the movable arm and the groove could be formed in the heat block. Other tongue-and-groove connections may be effectuated by forming different shaped tongue and grooves. For example, a square shaped tongue may be formed in heat block 20 and a mating groove formed in movable arm 24. To reduce friction, linear bearings 42 may be used as well as low friction pads 44 or lubricants.

Figure 3:
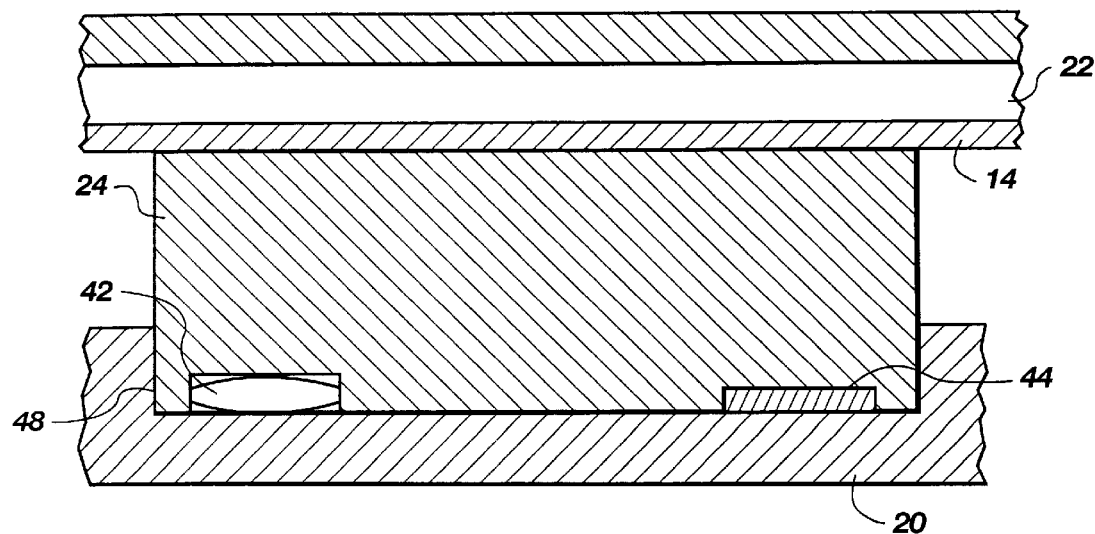
FIG. 3 is a cross-sectional view taken along A—A of the present invention as depicted in FIG. 1 and further shows another method of dynamic attachment.

Referring to drawing FIG. 3, another method for dynamically attaching movable arm 24 to the heat block 20 is by having movable arm 24 travel in a track 48 that is formed in heat block 20. Thus, movable arm 24 is allowed to slide with respect to heat block 20 while maintaining contact with the heat block for efficient heat transfer. Again, movement may be facilitated by the use of linear bearings 42 or low friction pads 44 or lubricants. Other methods for dynamically attaching the movable arm 24 to the heat block 20 are tracks, a track-and-carriage system, a hinge, cam arrangement, etc.

Figure 4:
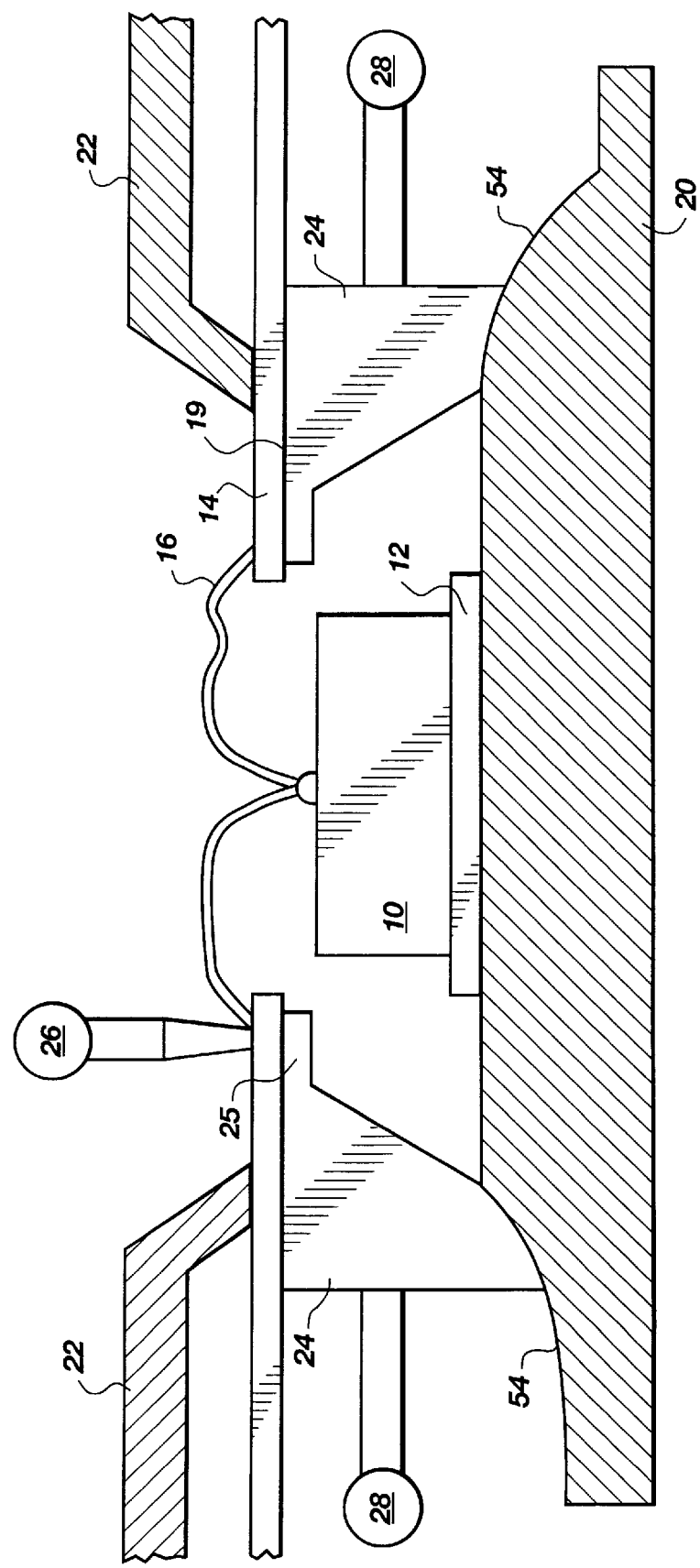
FIG. 4 is a side view of an alternative embodiment of the present invention used in the wire bonding of a semiconductor device arrangement having a conventional lead frame.

Referring to drawing FIG. 4, movable and/or adjustable arm 24 may be attached to heat block 20 such that the direction of travel with respect to lower surface 19 of lead fingers 14 is angular or arcuate. A radius 54 may be formed in heat block 20 and movable and/or adjustable arm 24 such that the direction of travel of lead support portion 25 and movable arm 24 is arcuate with respect to lower surface 19 of the lead fingers 14 of a conventional lead frame as the lead support portion is positioned prior to wire bonding.

Figure 5:
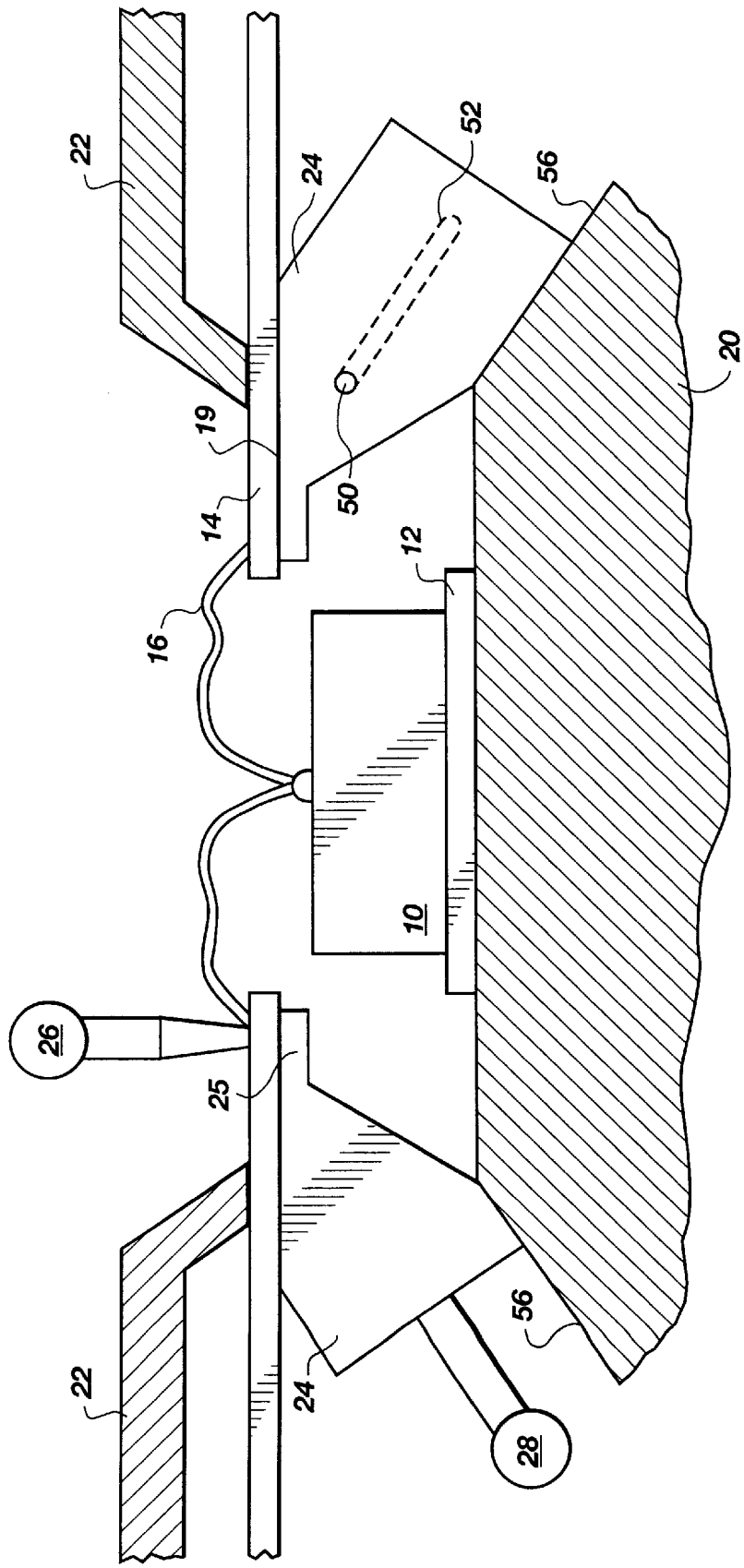
FIG. 5 is a side view of an alternative embodiment of the present invention used in the wire bonding of a semiconductor device arrangement having a conventional lead frame.

Referring to drawing FIG. 5, the surface of the heat block 20 and movable and/or adjustable arm 24 may also be angled 56 with respect to lower surface 19 of the lead fingers 14 such that the direction of travel of lead support portion 25 and movable arm 24 is angular with respect to lower surface 19 of lead fingers 14 as the lead support portion 25 of movable arm 24 is positioned prior to the wire bonding process.

The movement of the movable and/or adjustable arm 24 and the heat block 20 may be integrated so that as the heat block moves into position it causes the movable arm to move into position. In FIG. 5, a notch 50 is shown formed in movable arm 24 and extending into a slot 52 formed in a stationary member (not shown). Thus, as the heat block 20 moves upward to contact the die 10, the heat block pushes against the movable and/or adjustable arm 24 which is forced to travel upward and inward by the notch 50 traveling in the slot 52.

Figure 6:
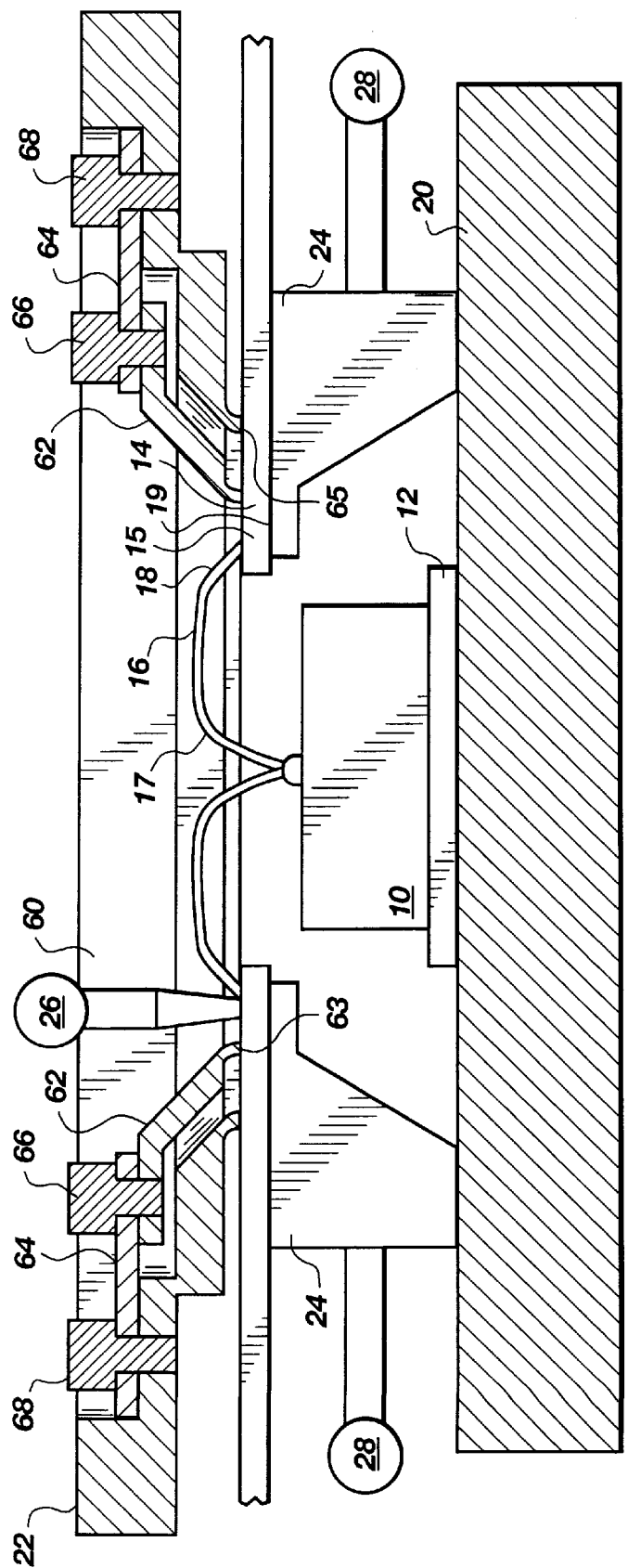
FIG. 6 is a side view of an alternative embodiment of the present invention used in the wire bonding of a semiconductor device arrangement having a conventional lead frame.

Referring to drawing FIG. 6, a dual clamp assembly is shown in conjunction with the movable and/or adjustable arms 24 in order to further stabilize the lead fingers during the wire bonding process. The conventional clamp 22 acts as a primary clamp and includes a bond site window 60. The bond site window 60 is sized to allow access for a wire bonding apparatus 26 to a plurality of bond pads of semiconductor die 10 and to a plurality of lead fingers 14 of a conventional lead frame.

The bond site window 60 includes a secondary clamp 62. The secondary clamp 62 is mounted to a resilient plate 64 with a first set screw or bolt 66. The proximal end of each plate 64 is attached to the conventional clamp 22 with a second set screw or bolt 68. It is, of course, understood that secondary clamp 62 can be attached to the clamp 22 in any number of known configurations, including forming the clamp 62 with an integral resilient portion which is secured to the clamp 22 or forming (for example, as by machining) the secondary clamp 62 as an integrated, resilient appendage of the clamp 22. It is, of course, also understood that any number of secondary clamps 62 can be used, consistent with the need for adequate clearances for wire bonding.

When a semiconductor die 10 and a lead frame strip including lead fingers 14 of a conventional lead frame is aligned with the bond site window 60 in the clamp 22 and pressure is exerted on the lead frame, the contact end 63 of the secondary clamp 62 contacts the movable arm 24 through lead fingers 14 extending from the lead frame over the active die surface. The secondary clamp 62 does not damage the semiconductor die 10 under the secondary clamp contact end 63 because of the resilient nature of the secondary clamp 62 and because of movable arm 24 positioned between the semiconductor die 10 and the secondary clamp 62.

The semiconductor die 10 has a conventional lead frame arrangement wherein the lead fingers 14 extend adjacent the upper (active) semiconductor die 10. The bond site window contact lip 65 contacts the lead fingers 14 around the periphery of the semiconductor die 10. The secondary clamp 62 extends toward the center of the semiconductor die 10. A plurality of bond wires 16 is then attached between the bond pads of the semiconductor die 10 and the lead fingers 14.

The contact end 63 of the secondary clamp 62 in its unbiased state preferably extends slightly below a peripheral lead finger contact lip 65 of the bond site window 60 of the clamp 22. The secondary clamp 62 may be formed from a substantially rigid, non-deformable material such as metal, high-temperature plastic, fiber composites, or the like. A preferred material for the secondary clamp 62 is 440C stainless steel.

Figure 7:
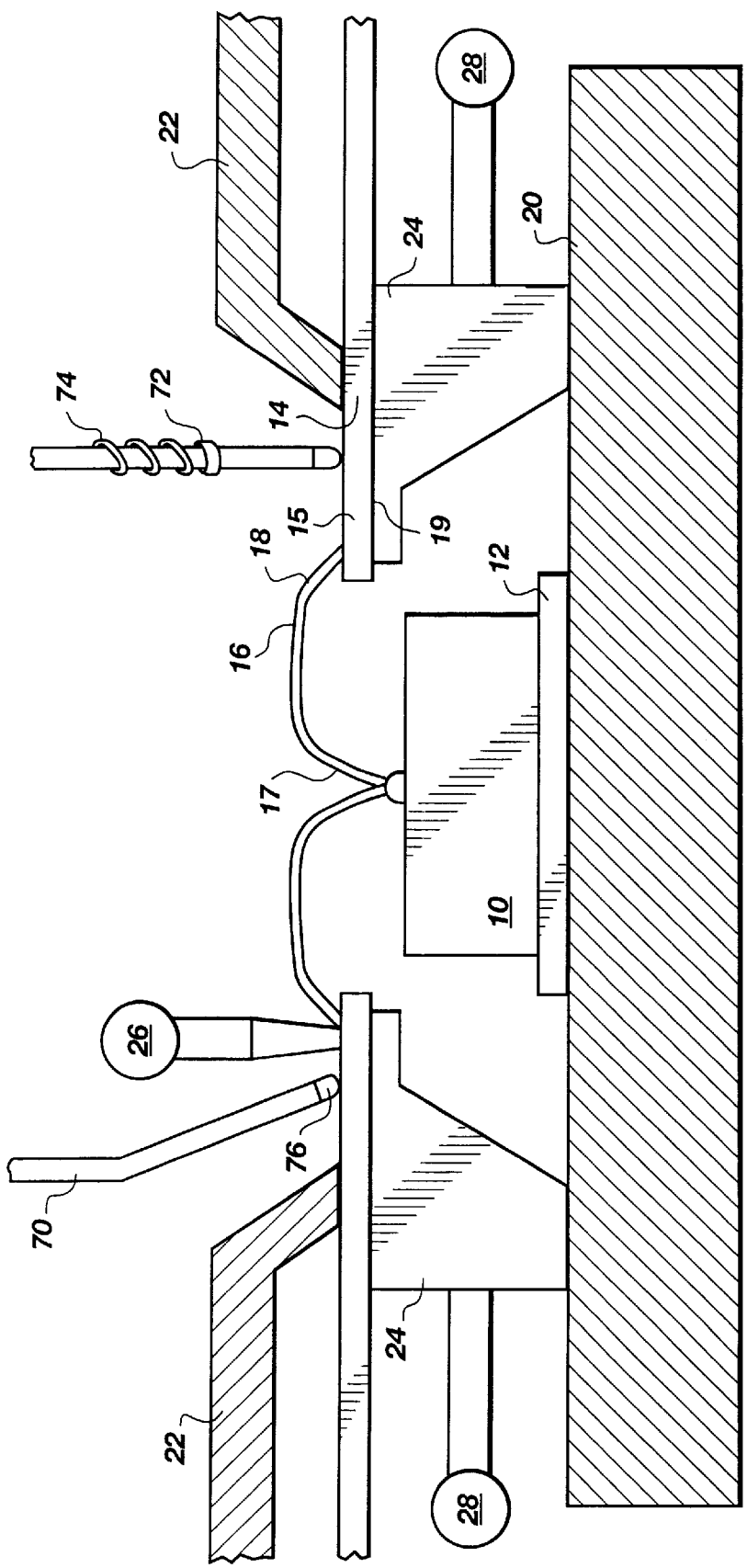
FIG. 7 is a side view of an alternative embodiment of the present invention used in the wire bonding of a semiconductor device arrangement having a conventional lead frame.

Referring to drawing FIG. 7, an independently actuated lead clamp is shown in conjunction with the movable and/or adjustable arms 24 in order to further stabilize the lead fingers during the wire bonding process. Independently actuated lead clamp 70 may be used in place of or in addition to the conventional clamp 22 to maintain the lead finger 14 in position during the bonding process. The independent clamp 22 helps insure that the lead finger is in contact with the movable arm 24 during the bonding process and helps minimize any deflection of the end 15 of the lead finger 14 so that the bonding apparatus 26 accurately and precisely contacts the end 15 to provide the desired wire bond. The action of independent clamp 70, and if desired the additional use of fixed clamp 22, provides improved clamping of a lead finger 14 during the wire bonding process as well as insures that the lead finger 14 of a conventional lead frame is in intimate contact with the movable arm 24 for effectiveness.

Independent clamp 70 may be of any suitable shape for use in independently clamping the lead finger 14, in place of the use of conventional fixed clamp 22, such as square, semicircular, rectangular, arcuate, etc. Also, the independent clamp 70 may be resiliently mounted through the use of a shoulder 72 thereon abutting a spring 74 to control the amount of the force exerted on any lead finger 14 during the wire bonding operation. If desired, the independent clamp 70 may include insulation or cushioning 76 on the end thereof The independent clamp 70 is actuated independently of bonding apparatus 26 and has the capability of independent movement along the x-axis, y-axis and z-axis with respect to the bonding apparatus 26. The independent clamp 70 is also free to move about the bonding apparatus 26 and the central axis of the die 10 so that any lead finger 14 of a conventional lead frame that is to be connected to bond pads on the die 10, regardless of location, may be accommodated. The independent clamp 70 does not need to be, and preferably is not, concentrically centered about the bonding apparatus 26 so that it will not interfere with the operation thereof. Any desired number of independent clamps 70 may be used about the bonding apparatus to minimize the amount of movement of the independent clamp 70 between wire bonding operations. The independent clamp 70 may be located in quadrants about the die 10 in any manner as desired.

During the bond operation, one or more of the independent clamps 70 clamps the end 15 of lead finger 14 of a conventional lead frame prior to the bonding of a wire 16 thereto by one or more of the bonding apparatus 26. The independent clamp 70 applies sufficient pressure to the end 15 of lead finger 14 to press the lead finger 14 against moveable and/or adjustable arm 24 to insure a satisfactory bond between the end 18 of any wire 16 and the end 15 of the lead finger 14.

As shown, one, or more, of the independent clamps 70 contacts the end 15 of lead finger 14 aft of the area of the wire bond 18 to the lead finger 14. The bonds of the wire end 18 to the end 15 of the lead finger 14 are typically a wedge type wire bond, although a ball bond may be made if desired. As shown, the heat block 20 is in contact with the paddle 12 and the movable and/or adjustable arm 24, which, in turn, is in contact with the lead fingers 14.

The independent lead clamp 70 may have a modified end or foot thereon to provide a larger clamping area of the clamp 70 on the end 15 of the lead finger 14 during bonding operations. The modified end or foot may be substantially the same width as the lead finger 14 of a conventional lead frame and may be mounted to have articulated movement about the end of the independent clamp 70, such as using a pin extending through suitable apertures in a pair of ears attached to the foot.

The independent clamp 70 may be integrally attached to the clamp 22 or may have an articulated mounting arrangement. The modified end or foot may be generally semicircular, or arcuate, in configuration so as to engage a large portion of the end 15 of the lead finger 14 of a conventional lead frame surrounding the bonding apparatus 26 during the wire bonding operation to hold the end 15 in position.

The independent clamp 70 may also be used in conjunction with a second independently actuated clamp. The second independently actuated clamp may be of any suitable type and structure such as described and illustrated hereinbefore. The clamp 70 and the second clamp may be actuated independently of each other and independently of the bonding apparatus 26 as described and illustrated hereinbefore.

Figure 8:
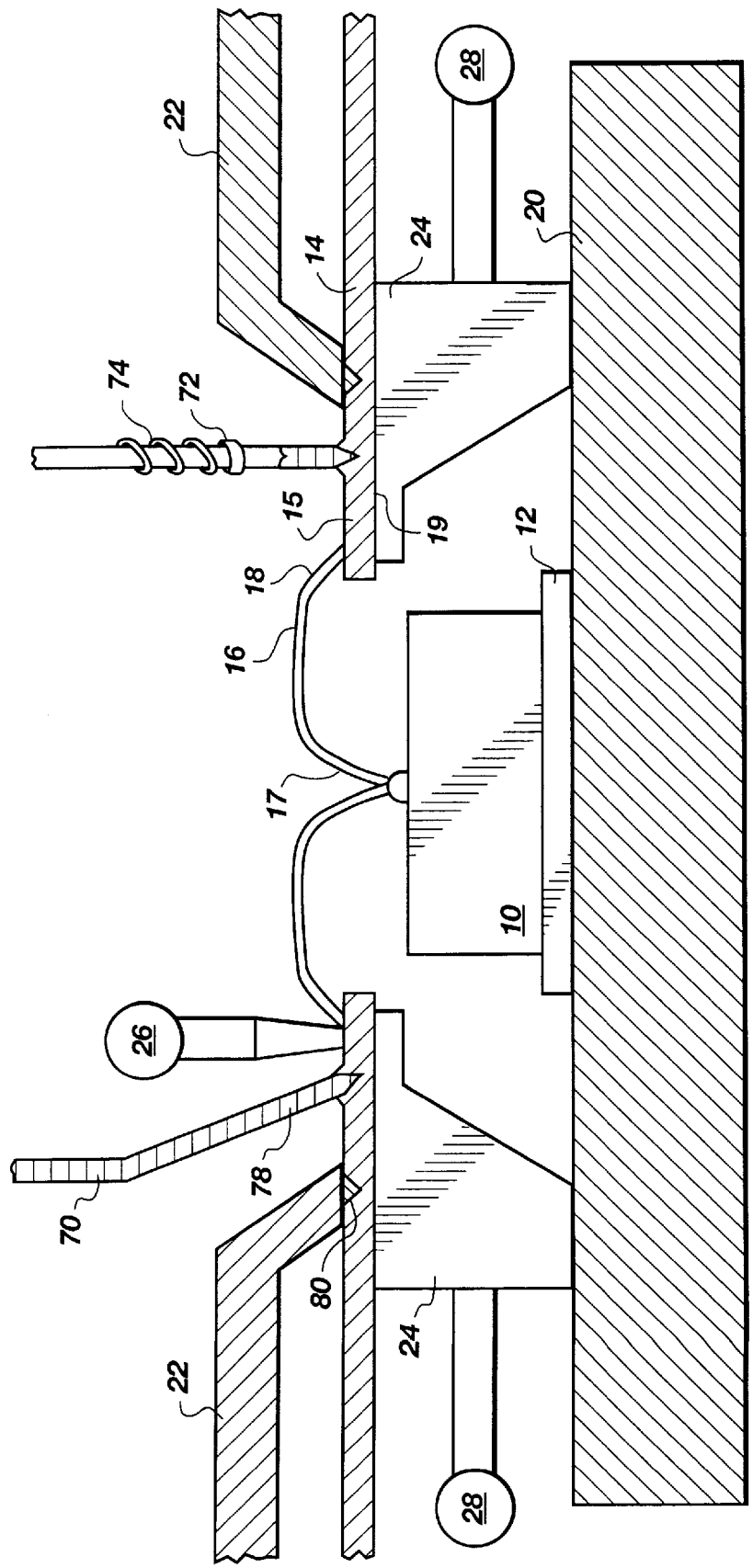
FIG. 8 is a side view of an alternative embodiment of the present invention used in the wire bonding of a semiconductor device arrangement having a conventional lead frame.

Referring to drawing FIG. 8, an independently actuated lead clamp is shown having a lead finger penetrating portion 78 on the bottom thereof used in place of or in addition to the conventional clamp 22 to maintain the lead finger 14 of a conventional lead frame during the bonding process. One or more of the independent clamps 70 having penetrating portions 78 located thereon contacts and penetrates the end 15 of lead finger 14 aft of the area of the wire end 18 to the lead finger 14. The independent clamp 70 having lead penetrating portion 78 thereon may be of any suitable shape for use in independently clamping the lead finger 14, in place of the use of conventional fixed clamp 22, such as square, semicircular, rectangular, arcuate, etc. Also, as shown, the independent clamp 70 having lead penetrating portion 78 thereon may be resiliently mounted through the use of a shoulder 72 thereon abutting a spring 74 to control the amount of force exerted on any lead finger 14 during the wire bonding operation. As described hereinbefore, the independent clamp 70 having lead penetrating portion 78 thereon is actuated independently of bonding apparatus 26 and has the capability of independent movement along the x-axis, y-axis and z-axis with respect to the bonding apparatus 26. The independent clamp 70 having lead penetrating portion 78 thereon is also free to move about the bonding apparatus 26 and the central axis of the die 10 so that any lead finger 14 of a conventional lead frame that is to be connected to a bond pad on the die 10, regardless of location, may be accommodated. The independent clamp 70 having lead penetrating portion 78 thereon does not need to be, and preferably is not, concentrically centered about the bonding apparatus 26 so that it will not interfere with the operation thereof. Any desired number of independent clamps 70 having lead penetrating portion 78 thereon may be used about the bonding apparatus to minimize the amount of movement of the independent clamp 70 between wire bonding operations. Also, the independent clamps 70 may be located in quadrants about the die 10, or in any manner as desired.

The independently actuated lead clamp has a lead finger penetrating portion 78 on the bottom thereof used in place of or in addition to the conventional clamp 22 to maintain the lead finger 14 in position during the bonding process. Such independent clamp 70 helps insure that the lead finger 14 is in contact with the moveable and/or adjustable arm 24 during the bonding process, immobilizes the lead finger 14 during the wire bonding process, and helps minimize any deflection of the end 15 of the lead finger 14 so that the bonding apparatus 26 accurately, precisely contacts the end 15 to provide the desired wire bond. The action of such independent clamp 70, and, if desired the additional use of fixed clamp 22, provides improved clamping and immobilization of a lead finger 14 during the wire bonding process as well as insures that the lead finger 14 is in intimate contact with the moveable and/or adjustable arm 24 for effectiveness.

During the wire bonding process, it is desirable for the heat block to be heated as previously described hereinbefore. Similarly, the bonding apparatus should exert substantially the same amount of force as described hereinbefore.

During the bond operation, one or more of the independent clamps 70 having a lead finger penetrating portion 78 located on the end thereof clamps the end 15 of lead finger 14 prior to the bonding of a wire 16 thereto by one or more of the bonding apparatus 26. The independent clamp 70 applies sufficient pressure to the end 15 of the lead finger 14 to insure a satisfactory bond between the end of any wire 16 and the end 15 of the lead finger 14.

As shown, one or more of the independent clamps 70 contacts the end 15 of lead finger 14 aft of the area of the bond of wire end 18 to the lead finger 14. The bonds of the wire end 18 to the end 15 of the lead finger 14 are typically a wedge type wire bond, although a ball bond may be made if desired. As shown, the heat block 20 is in contact with the paddle 12 of the lead frame. The lead fingers 14 of a conventional lead frame are in contact with the movable arm 24 which, in turn, is in contact with the heat block 20.

As also shown, the fixed clamps 22 are formed to have a penetrating portion 80 thereon which penetrates the end 15 of lead finger 14 of a conventional lead frame. In this manner, the fixed clamp 22 provides improved clamping and immobilization of a lead finger 14 during the wire bonding process as well as insures that the lead finger 14 is in intimate contact with the movable and/or adjustable arm 24 for effectiveness. As shown, the clamps 22 and 70 having lead finger penetrating portions thereon cause the lead finger 14 to engage the movable arm 24 with the movable arm being in contact with the heat block 20. However, care should be taken to prevent the lead penetrating portion 78 of the clamp 70 from either damaging the lead finger 14, affecting its electrical characteristics, or severing the lead finger 14.

The independent lead clamp 70 may be formed having a modified end or foot thereon to provide a larger clamping area of the clamp 70 on the end 15 of the lead finger 14 during bonding operations. The modified end or foot is substantially the same width as the lead finger 14 and may be mounted to have articulated movement about the end of the independent clamp 70, such as using a pin extending through suitable apertures in a pair of ears attached to the foot and the end of the modified independent clamp 70. Located on the bottom of the modified end or foot of the clamp 70 are suitable lead finger penetrating members which penetrate the lead finger 14 to immobilized it during wire bonding operations as described hereinbefore. The penetrating portion 78 may comprise a plurality of round shaped members located to either extend along the axis of a lead finger 14 or extend transversely thereof or may comprise a knife edge shape extending transversely across the axis of a lead finger 14. The shapes are to be merely illustrative of a variety of shapes for the penetrating portion 78 which may be used. The modified end or foot may be semicircular, or arcuate, in configuration so as to engage a large portion of the end 15 of the lead finger 14 surrounding the bonding apparatus 26 during the wire bonding operation to hold the end 15 in position. Also, a soft metal coating located on the lead finger 14 may be penetrated by either the clamp 70 or the clamp 22. The soft metal coating applied to the lead finger 14 may be of any suitable type, such as gold, silver, aluminum, etc., which will allow for the easy penetration of the coating by a portion of either the clamp 70 or the clamp 22. The clamp 70 may act on the opposite side of the lead from the bonding apparatus 26. It should be understood that any of the penetrating clamps hereinbefore described may act on the opposite side of the lead clamp 22 during the wire bonding operations regarding a lead finger 14. It is not necessary that the penetrating clamp be positioned on the same side of the lead finger 14 as the bonding apparatus 26.

Figure 9:
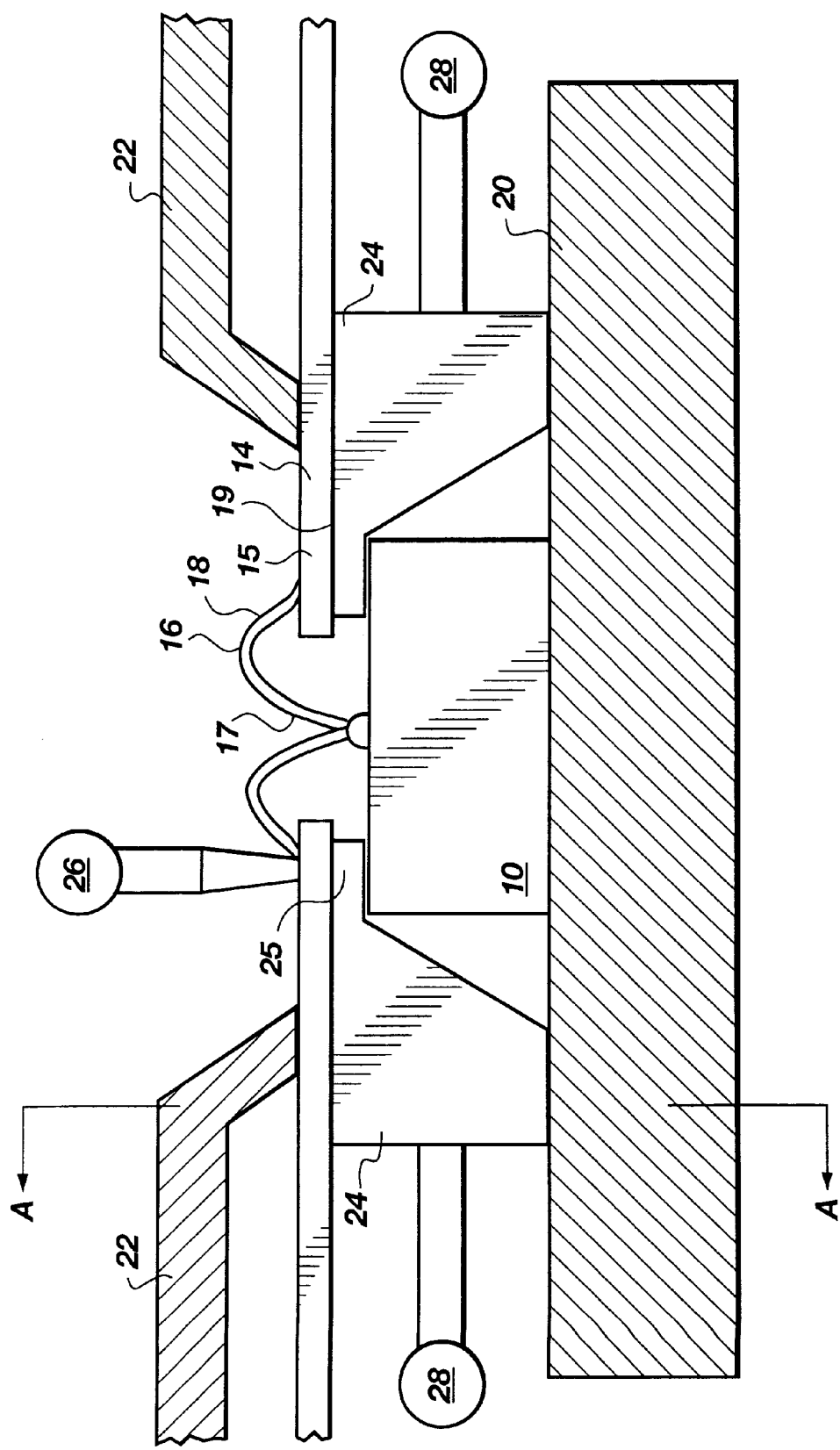
FIG. 9 is a side view of the present invention used in the wire bonding of a semiconductor device arrangement having an LOC lead frame without the leads adhered to the semiconductor device.

Referring to drawing FIG. 9, a semiconductor device (die) 10 is shown in relation to a leads-over-chip (LOC) lead frame without being supported directly by adhesive connection to the lead fingers 14 of the lead frame. (Note, that as shown in FIGS. 9 through 14, the die 10 is supported only by the wire 16 between the bond pads on the die 10 and the lead fingers 14.) A heat block 20 is used to heat the die 10 during the wire bonding process. As shown, a suitable wire 16, as described hereinbefore, has one end thereof 17 bonded to a bond pad of the die 10. The wire 16 may be of any suitable type for connection and bonding purposes, such as gold, gold alloy, aluminum, aluminum alloy, etc. The other end 18 of the wire 16 is shown being bonded to the end 15 of a lead finger 14 of the lead frame by a suitable bonding apparatus 26. The bonding apparatus 26 may be of any suitable type well known in the bonding area, such as described hereinbefore. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. Further shown in drawing FIG. 9 is movable arm 24 having a lead support portion 25 attached to or an integral part of the movable arm 24. The movable arm 24 is dynamically attached to the heat block 20 so that the lead support portion 25 can be positioned between the die 10 and the lead fingers 14 of the LOC lead frame. The movable arm 24 and lead support portion 25 thus substantially prevent the application of any force against the die 10 from the bonding apparatus 26 and the clamp 22. In addition, movable arm 24 and lead support portion 25 conduct heat from the heat block 20 to the lead fingers 14. The action of movable arm 24 and lead support portion 25 provide improved support of a lead finger 14 during the wire bonding process as well as insure that the force applied by bonding apparatus 26 and clamp 22 is substantially against lead support portion 25 and movable arm 24 rather than against the die 10. After the bonding of the wire 16 to the lead fingers 14 of the LOC lead frame, the wires 16 support the die 10 during subsequent molding operations to encapsulate the die 10 and a portion of the LOC lead frame.

The movement of the movable arm 24 may be effectuated by various means 28, such as described hereinbefore.

The movable arm 24 is dynamically attached to the heat block 20 so that as the heat block moves into position during the wire bonding process. The movable arm and lead support portion 25 move into position between the lead fingers 14 and the die 10. As shown, movable arm 24 is shown as traveling against the heat block 20 such that the direction of travel is substantially parallel with respect to the lower surface 19 of the lead fingers 14 of a LOC lead frame.

Figure 10:
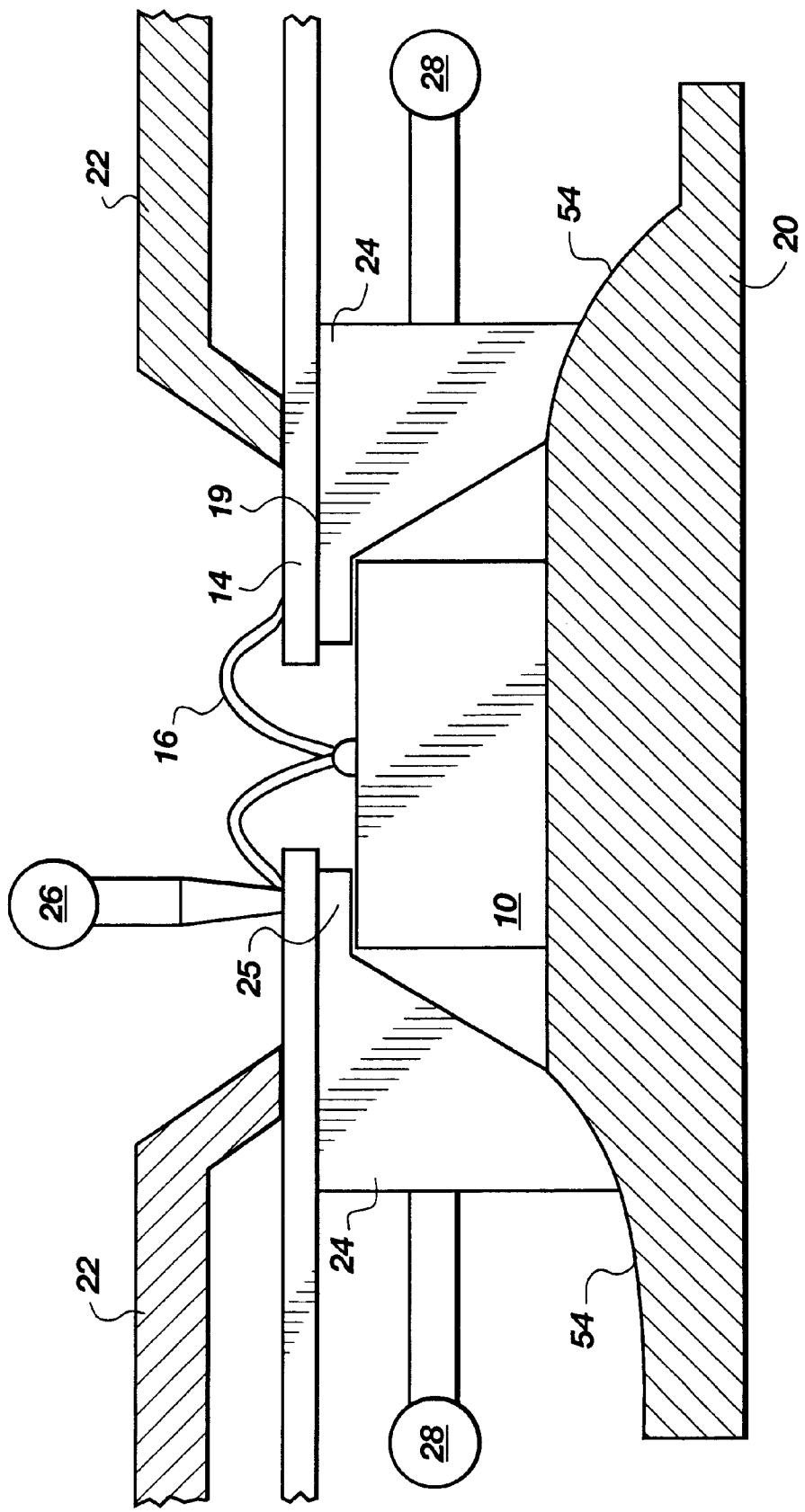
FIG. 10 is a side view of an alternative embodiment of the present invention used in the wire bonding of a semiconductor device arrangement having an LOC lead frame without the leads adhered to the semiconductor device.

Referring to drawing FIG. 10, movable arm 24 may be attached to heat block 20 such that the direction of travel with respect to lower surface 19 of lead fingers 14 of a LOC lead frame is angular or arcuate. A radius 54 may be formed in heat block 20 and movable arm 24 such that the direction of travel of lead support portion 25 and movable arm 24 is arcuate with respect to lower surface 19 of the lead fingers 14 of a conventional lead frame as the lead support portion is positioned prior to wire bonding.

Figure 11:
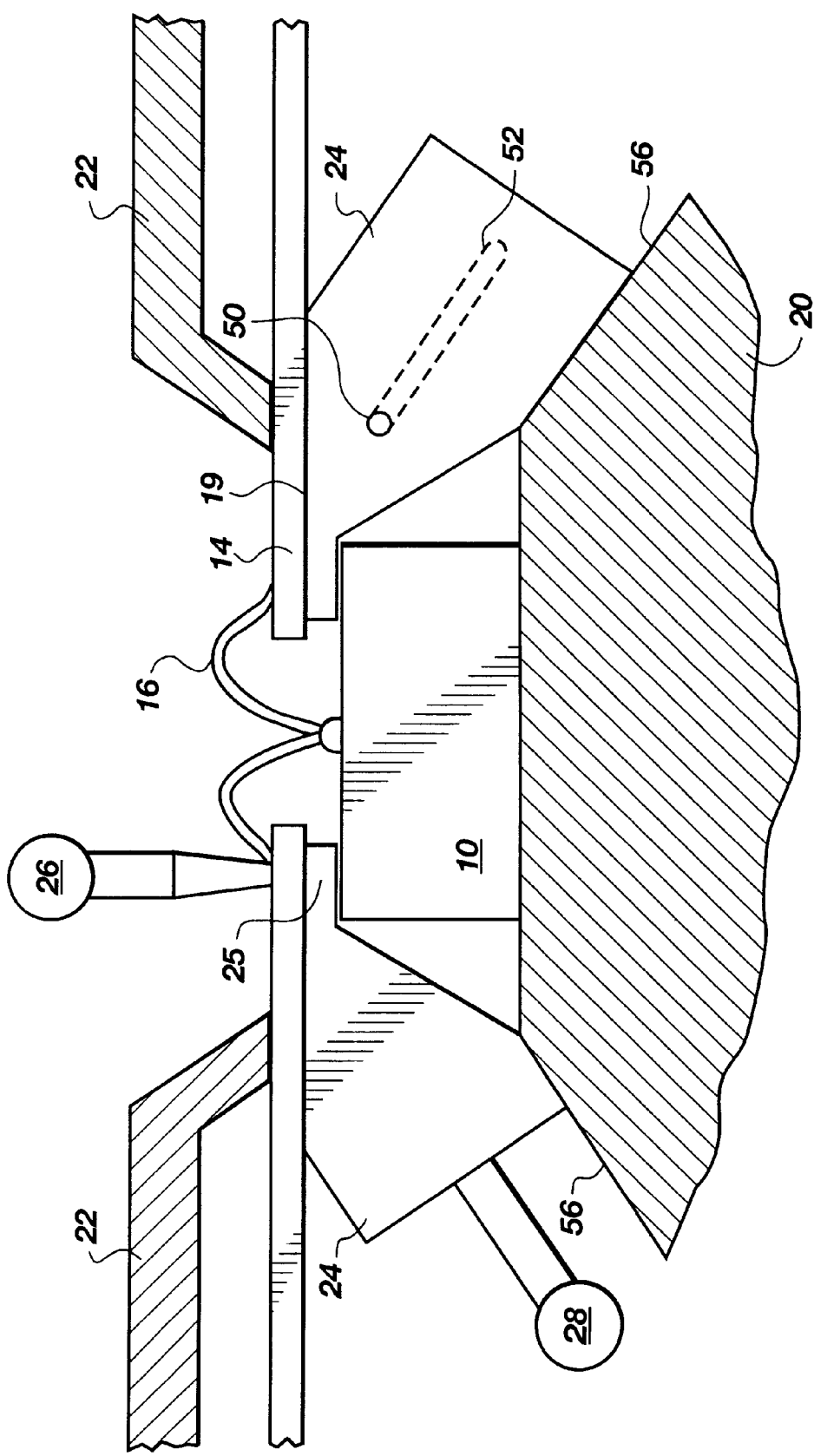
FIG. 11 is a side view of an alternative embodiment of the present invention used in the wire bonding of a semiconductor device arrangement having an LOC lead frame without the leads adhered to the semiconductor device.

Referring to drawing FIG. 11, the surface of the heat block 20 and movable arm 24 may also be angled 56 with respect to lower surface 19 of the lead fingers 14 of a LOC lead frame such that the direction of travel of lead support portion 25 and movable arm 24 is angular with respect to lower surface 19 of lead fingers 14 of a LOC lead frame as the lead support portion and movable arm are positioned prior to the wire bonding process.

The movement of the movable arm 24 and the heat block 20 may be integrated so that as the heat block moves into position it causes the movable arm to move into position. As shown, notch 50 is formed in movable arm 24 and extending into a slot 52 formed in a stationary member (not shown). Thus, as the heat block 20 moves upward to contact the die 10, the heat block pushes against the movable arm 24 which is forced to travel upward and inward by the notch 50 traveling in the slot 52.

Figure 12:
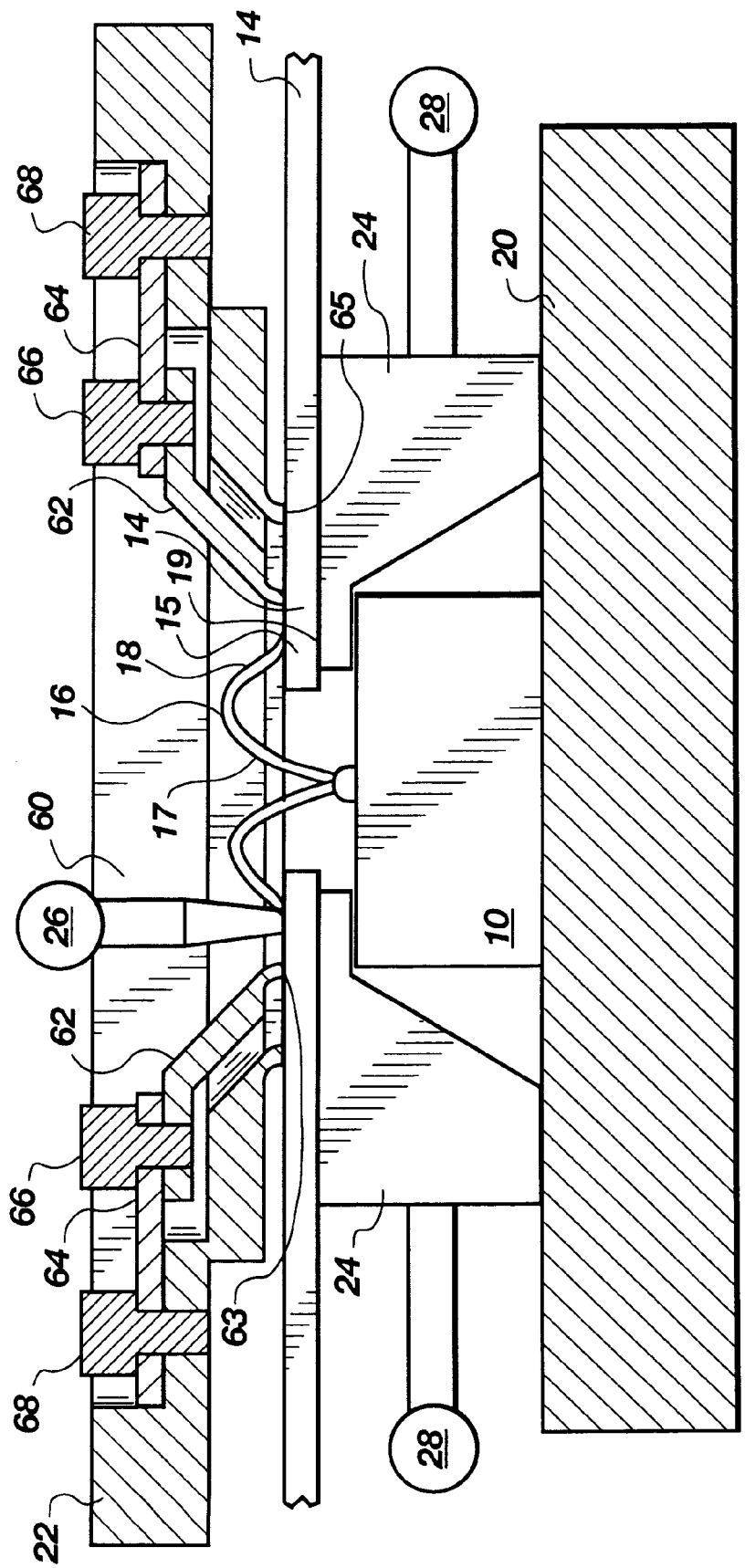
FIG. 12 is a side view of an alternative embodiment of the present invention used in the wire bonding of a semiconductor device arrangement having an LOC lead frame without the leads adhered to the semiconductor device.

Referring to drawing FIG. 12, a dual clamp assembly is shown in conjunction with the movable arms in order to further stabilize the lead fingers 14 of an LOC lead frame during the wire bonding process. The conventional clamp 22 acts as a primary clamp and includes a bond site window 60. The bond site window 60 is sized to allow access for a wire bonding apparatus 26 to a plurality of bond pads of semiconductor die 10 and to a plurality of lead fingers 14 of a conventional lead frame.

The bond site window 60 includes a secondary clamp 62. The secondary clamp 62 has the same construction and operation as has been described hereinbefore.

The semiconductor die 10 has a LOC lead frame arrangement wherein the lead fingers 14 extend over the upper (active) semiconductor die 10. The bond site window contact lip 65 contacts the lead fingers 14 of the LOC lead frame around the periphery of the semiconductor die 10. The secondary clamp 62 extends toward the center of the semiconductor die 10. A plurality of bond wires 16 is then attached between the bond pads of the semiconductor die 10 and the lead fingers 14.

The contact end 63 of the secondary clamp 62 in its unbiased state preferably extends slightly below a window contact lip 65 of the bond site window 60 of the clamp 22.

Figure 13:
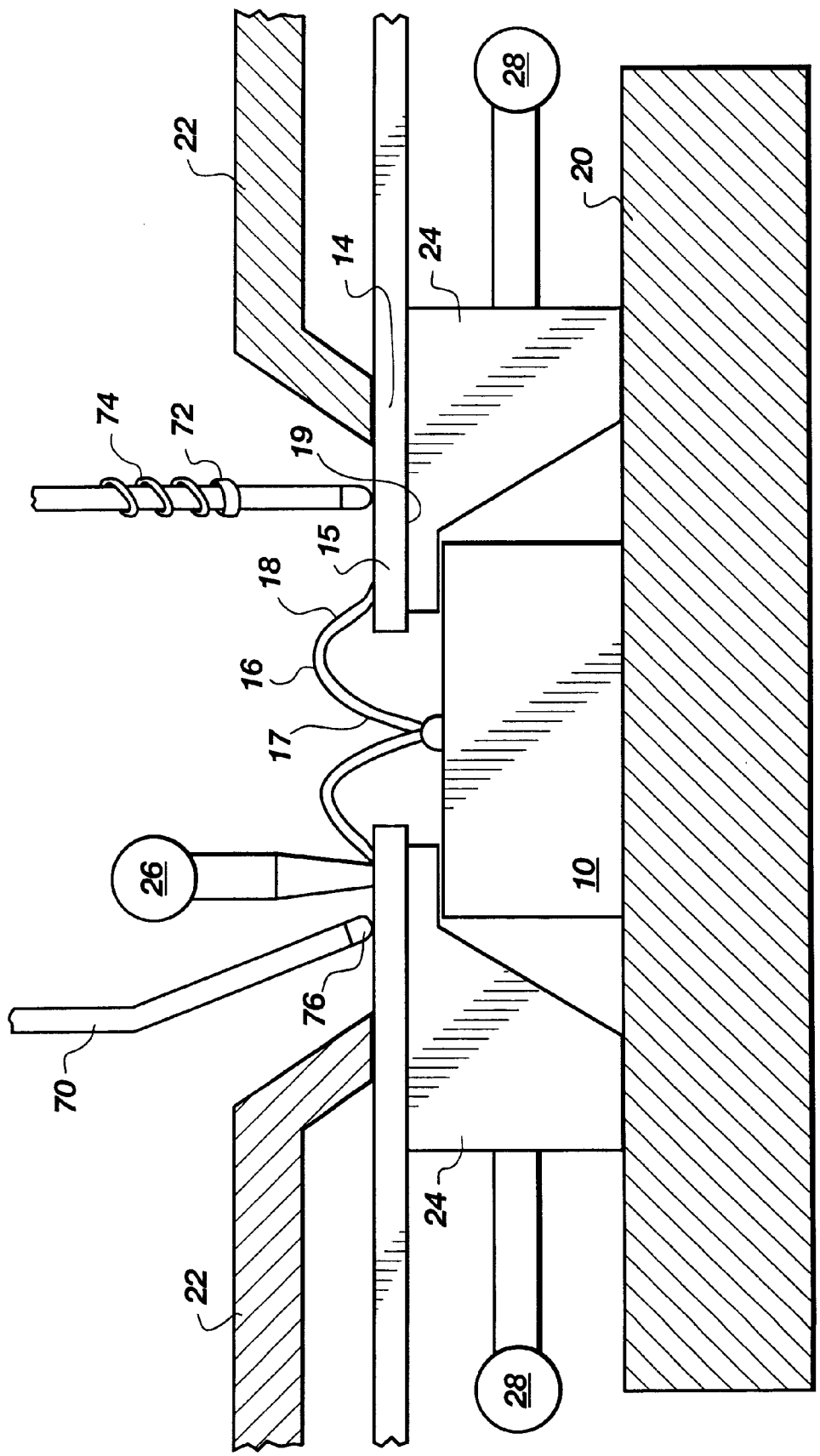
FIG. 13 is a side view of an alternative embodiment of the present invention used in the wire bonding of a semiconductor device arrangement having an LOC lead frame without the leads adhered to the semiconductor device.

Referring to drawing FIG. 13, an independently actuated lead clamp is shown in conjunction with the movable arms in order to further stabilize the lead fingers 14 of a LOC lead frame during the wire bonding process. Independently actuated lead clamp 70 may be used in place of or in addition to the conventional clamp 22 to maintain the lead finger 14 in position during the bonding process. The independent clamp 22 is the same as hereinbefore described in construction and operation to help insure that the lead finger is in contact with the movable arm 24 during the bonding process and helps minimize any deflection of the end 15 of the lead finger 14 so that the bonding apparatus 26 accurately and precisely contacts the end 15 to provide the desired wire bond. The action of independent clamp 70, and, if desired, the additional use of fixed clamp 22, provides improved clamping of a lead finger 14 during the wire bonding process as well as insures that the lead finger 14 of a conventional lead frame is in intimate contact with the movable arm 24 for effectiveness.

Figure 14:
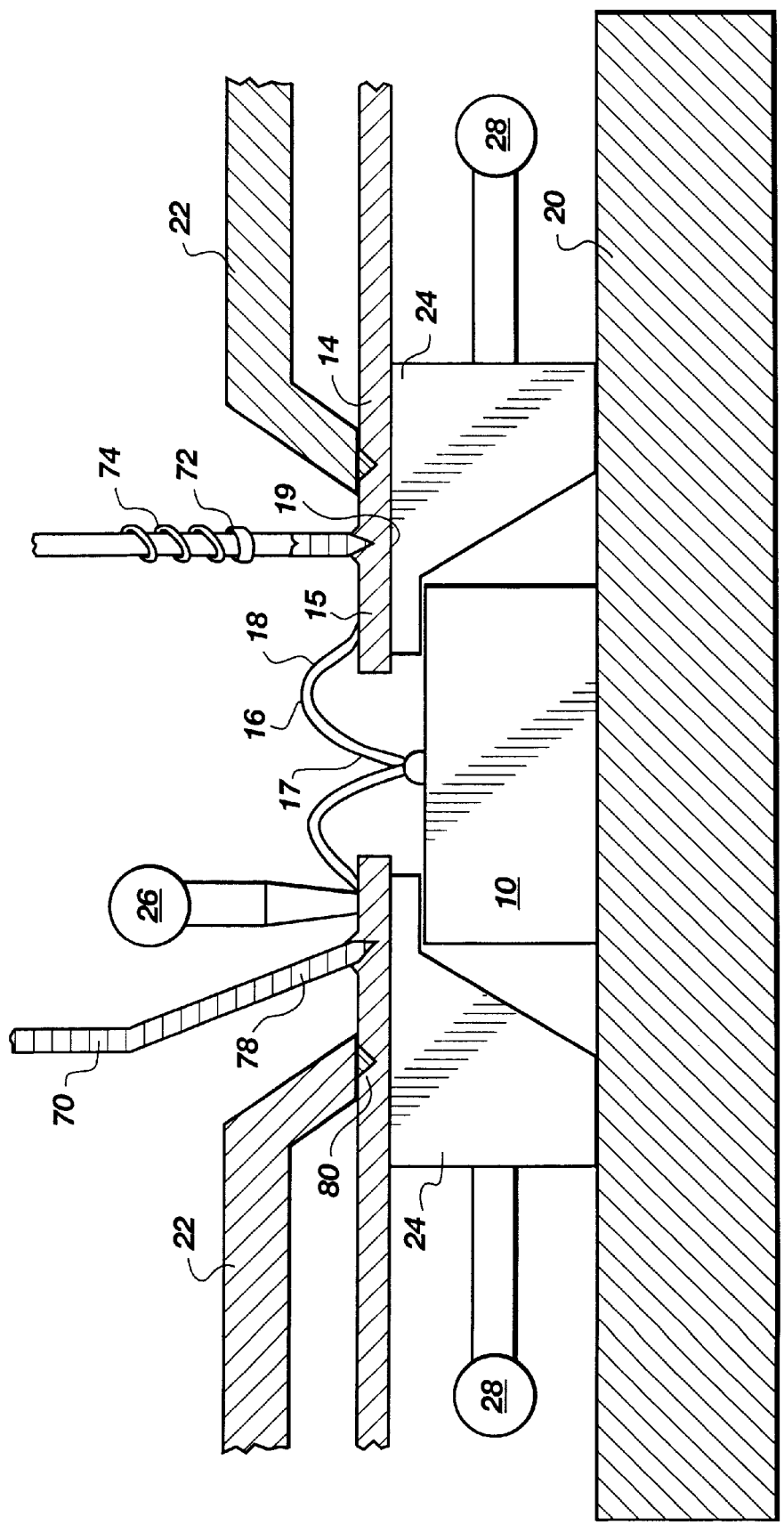
FIG. 14 is a side view of an alternative embodiment of the present invention used in the wire bonding of a semiconductor device arrangement having an LOC lead frame without the leads adhered to the semiconductor device.

Referring to drawing FIG. 14, as described hereinbefore, an independently actuated lead clamp 70 is shown having a lead finger penetrating portion 78 on the bottom thereof used in place of or in addition to the conventional clamp 22 to maintain the lead finger 14 of a LOC lead frame during the bonding process. One or more of the independent clamp 70 having penetrating portions 78 located thereon contacts and penetrates the end 15 of lead finger 14 aft of the area of the wire end 18 to the lead finger 14.

Figure 15:
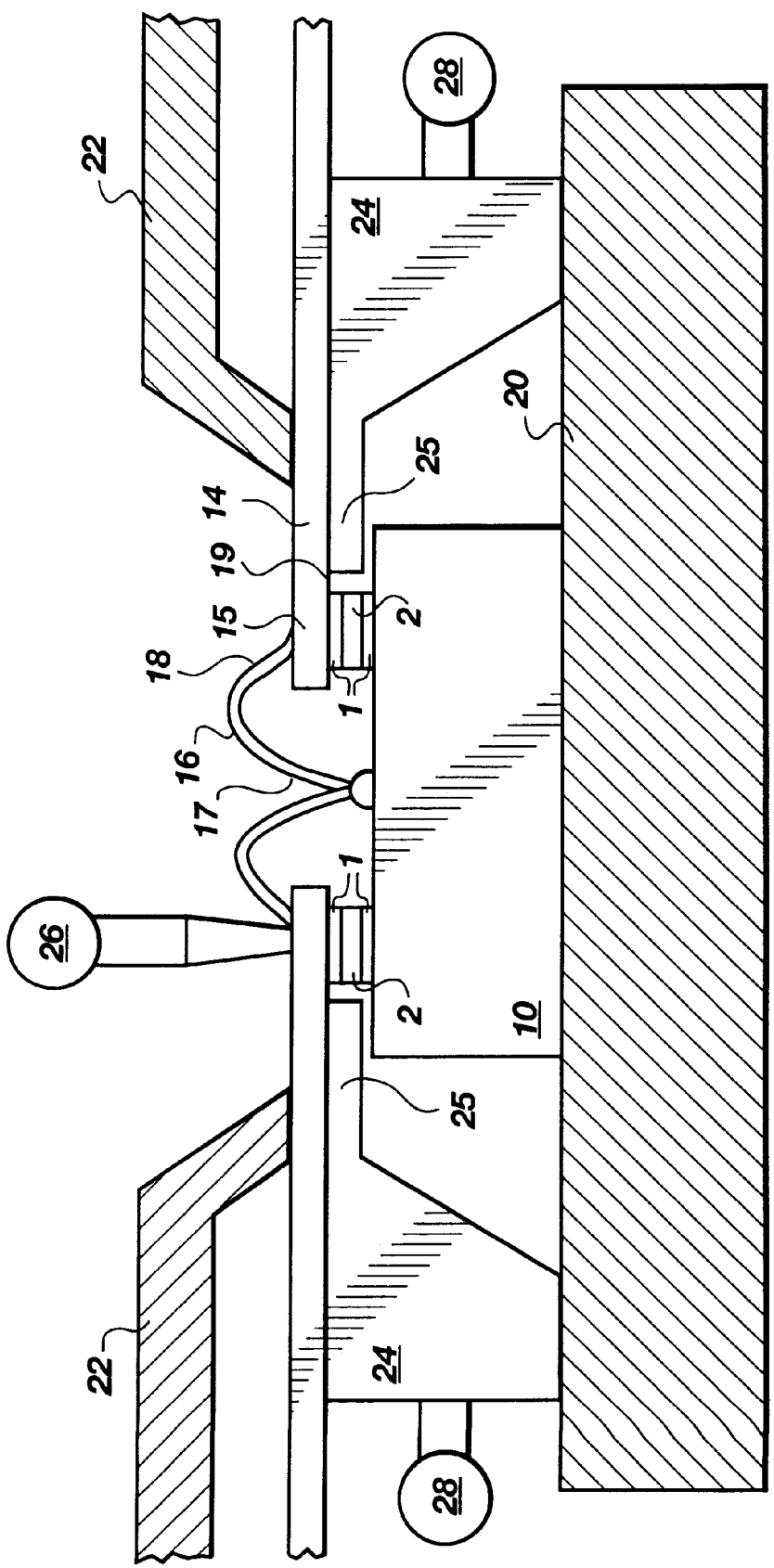
FIG. 15 is a side view of the present invention used in the wire bonding of a semiconductor device arrangement having an LOC lead frame with the leads adhered to the semiconductor device.

Referring to drawing FIG. 15, a semiconductor device (die) 10 is shown in relation to a leads-over-chip (LOC) lead frame being supported directly by adhesive attachment through adhesive coatings 1 on the tape 2 to the lead fingers 14 on the lead frame. (Also, note that as shown in FIGS. 15 through 20 a die 10 is shown in relation to a LOC lead frame being supported directly by adhesive attachment through adhesive coatings 1 on the tape 2 to the lead fingers 14 on the lead frame.) A heat block 20 is used to heat the die 10 during the wire bonding process. As shown, a suitable wire 16, as described hereinbefore, has one end thereof 17 bonded to a bond pad of the die 10. The other end 18 of the wire 16 is shown being bonded to the end 15 of a lead finger 14 of the lead frame by a suitable bonding apparatus 26. The bonding apparatus 26 may be of any suitable type well known in the bonding area as described hereinbefore. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. Further shown in drawing FIG. 15 is movable arm 24 having a lead support portion 25 attached to or an integral part of the movable arm 24. The movable arm 24 is dynamically attached to the heat block 20 so that the lead support portion 25 can be positioned between the die 10 and the lead fingers 14 of the LOC lead frame. The movable arm 24 and lead support portion 25 thus substantially prevent the application of any force against the die 10 from the bonding apparatus 26 and the clamp 22. In addition, movable arm 24 and lead support portion 25 conduct heat from the heat block 20 to the lead fingers 14. The action of movable arm 24 and lead support portion 25 provides improved support of a lead finger 14 during the wire bonding process as well as insures that the force applied by bonding apparatus 26 and clamp 22 is substantially against lead support portion 25 and movable arm 24 rather than against the die 10. During subsequent molding operations to encapsulate the die 10, a portion of the LOC lead frame of the die 10 is supported by the lead fingers 14 of the LOC lead frame through the adhesive 1 and tape 2.

The movement of the movable arm 24 may be effectuated by various means 28 as described hereinbefore.

The movable arm 24 is dynamically attached to the heat block 20 so that, as the heat block moves into position during the wire bonding process. The movable arm and lead support portion 25 move into position between the lead fingers 14 and the die 10. The movable arm 24 is shown as traveling against the heat block 20 such that the direction of travel is substantially parallel with respect to the lower surface 19 of the lead fingers 14 of a LOC lead frame.

Figure 17:
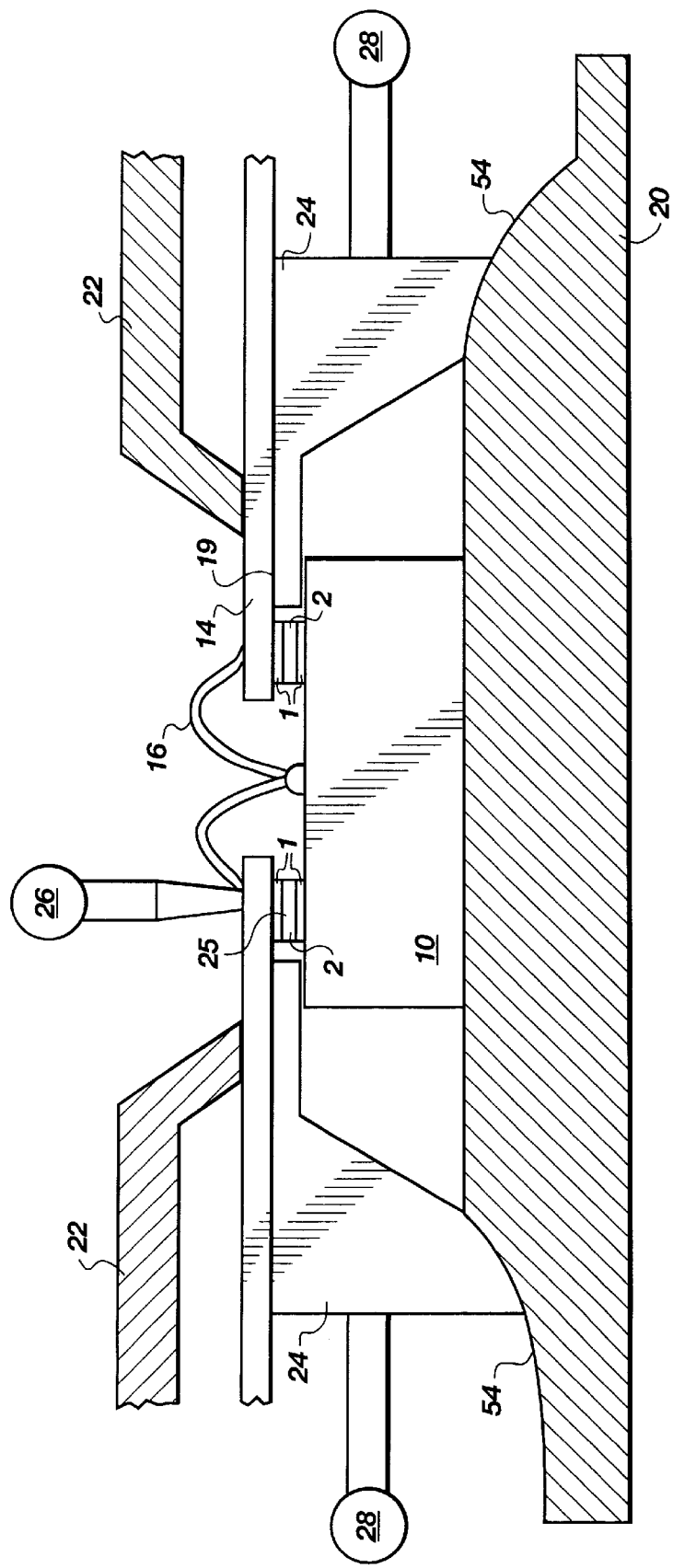
FIG. 17 is a side view of an alternative embodiment of the present invention used in the wire bonding of a semiconductor device arrangement having an LOC lead frame with the leads adhered to the semiconductor device.

Referring to drawing FIG. 17, movable arm 24 may be attached to heat block 20 such that the direction of travel with respect to lower surface 19 of lead fingers 14 of a LOC lead frame is angular or arcuate. A radius 54 may be formed in heat block 20 and movable arm 24 such that the direction of travel of lead support portion 25 and movable arm 24 is arcuate with respect to lower surface 19 of the lead fingers 14 of a conventional lead frame as the lead support portion is positioned prior to wire bonding.

Figure 16:
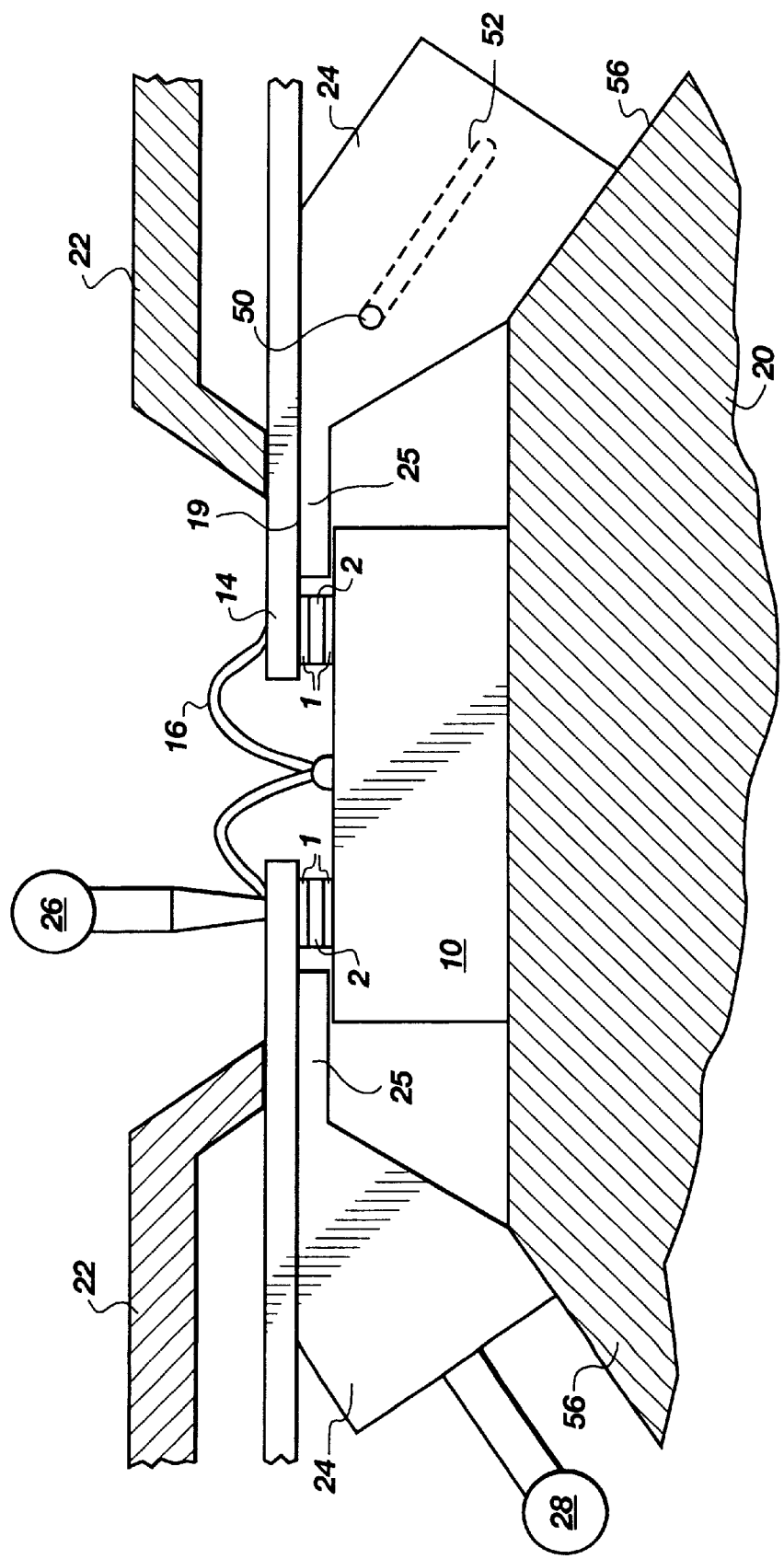
FIG. 16 is a side view of an alternative embodiment of the present invention used in the wire bonding of a semiconductor device arrangement having an LOC lead frame with the leads adhered to the semiconductor device.

Referring to drawing FIG. 16, the surface of the heat block 20 and movable arm 24 may also be angled 56 with respect to lower surface 19 of the lead fingers 14 of a LOC lead frame such that the direction of travel of lead support portion 25 and movable arm 24 is angular with respect to lower surface 19 of lead fingers 14 of a LOC lead frame as the lead support portion and movable arm are positioned prior to the wire bonding process.

The movement of the movable arm 24 and the heat block 20 may be integrated so that as the heat block moves into position it causes the movable arm to move into position. In FIG. 16, a notch 50 is shown formed in movable arm 24 and extending into a slot 52 formed in a stationary member (not shown). Thus, as the heat block 20 moves upward to contact the die 10, the heat block pushes against the movable arm 24 which is forced to travel upward and inward by the notch 50 traveling in the slot 52.

Figure 18:
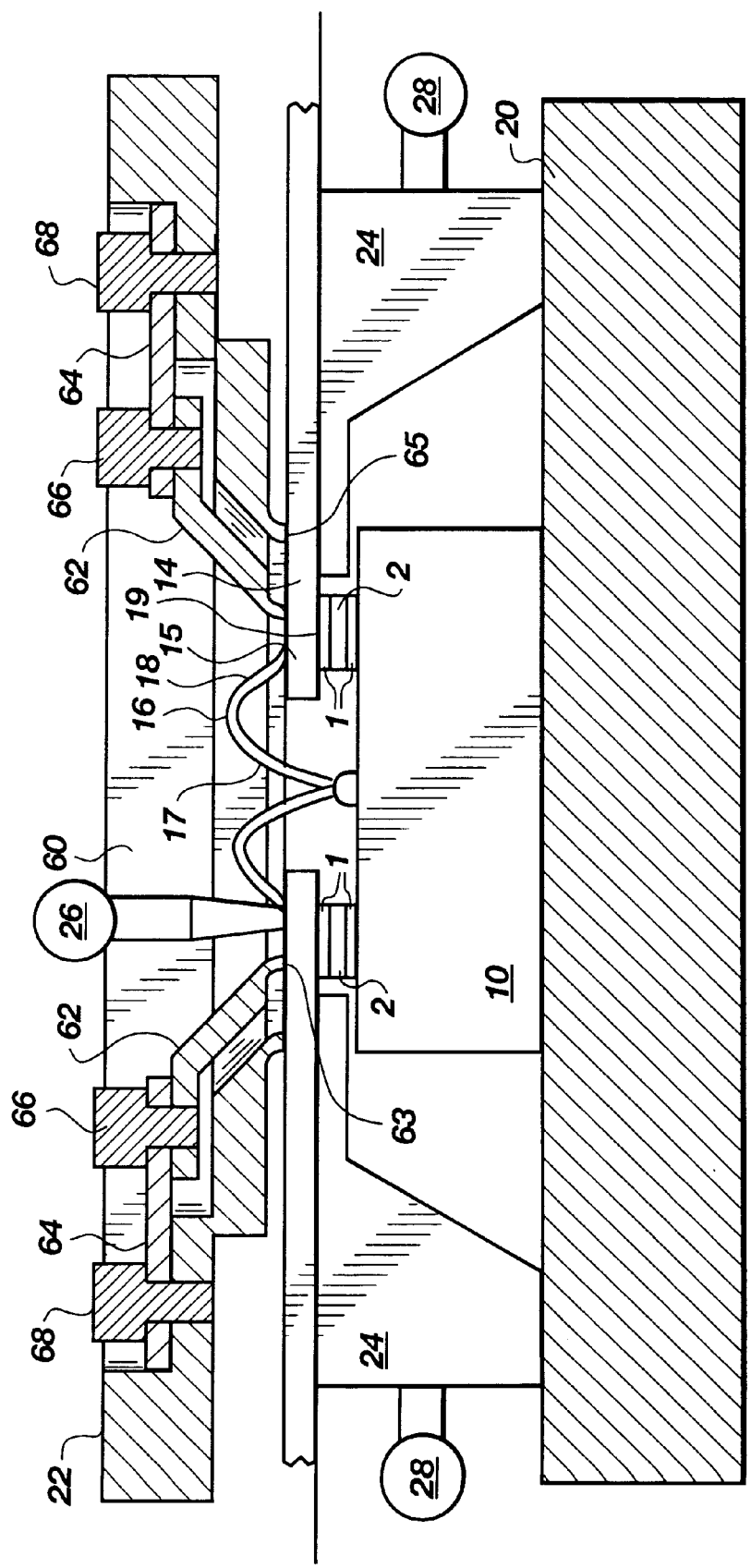
FIG. 18 is a side view of an alternative embodiment of the present invention used in the wire bonding of a semiconductor device arrangement having an LOC lead frame with the leads adhered to the semiconductor device.

Referring to drawing FIG. 18, a dual clamp assembly is shown in conjunction with the movable arms in order to further stabilize the lead fingers 14 of an LOC lead frame during the wire bonding process. The conventional clamp 22 acts as a primary clamp and includes a bond site window 60. The bond site window 60 is sized to allow access for a wire bonding apparatus 26 to a plurality of bond pads of semiconductor die 10 and to a plurality of lead fingers 14 of a conventional lead frame.

The bond site window 60 includes a secondary clamp 62. The secondary clamp 62 is mounted to a resilient plate 64 with a first set screw or bolt 66. The proximal end of each plate 64 is attached to the conventional clamp 22 with a second set screw or bolt 68. It is, of course, understood that secondary clamp 62 can be attached to the clamp 22 in any number of known configurations, including forming the clamp 62 with an integral resilient portion which is secured to the clamp 22 or forming (for example, as by machining) the secondary clamp 62 as an integrated, resilient appendage of the clamp 22. It is, of course, also understood that any number of secondary clamps 62 can be used, consistent with the need for adequate clearances for wire bonding.

As described hereinbefore, when a semiconductor die 10 and a lead frame strip including lead fingers 14 of a LOC lead frame are aligned with the bond site window 60 in the clamp 22 and pressure is exerted on the lead frame, the contact end 63 of the secondary clamp 62 contacts the movable arm 24 through lead fingers 14 extending from the lead frame over the active die surface. The secondary clamp 62 does not damage the semiconductor die 10 under the secondary clamp contact end 63 because of the resilient nature of the secondary clamp 62 and because of movable arm 24 positioned between the semiconductor die 10 and the secondary clamp 62. The semiconductor die 10 has a LOC lead frame arrangement wherein the lead fingers 14 extend over the upper (active) semiconductor die 10. The bond site window contact lip 65 contacts the lead fingers 14 of the LOC lead frame around the periphery of the semiconductor die 10. The secondary clamp 62 extends toward the center of the semiconductor die 10. A plurality of bond wires 16 is then attached between the bond pads of the semiconductor die 10 and the lead fingers 14.

The contact end 63 of the secondary clamp 62 in its unbiased state preferably extends slightly below a peripheral lead finger contact lip 65 of the bond site window 60 of the clamp 22. The secondary clamp 62 may be formed from a substantially rigid, non-deformable material such as metal, high-temperature plastic, fiber composites, or the like. A preferred material for the secondary clamp 62 is 440C stainless steel.

Figure 19:
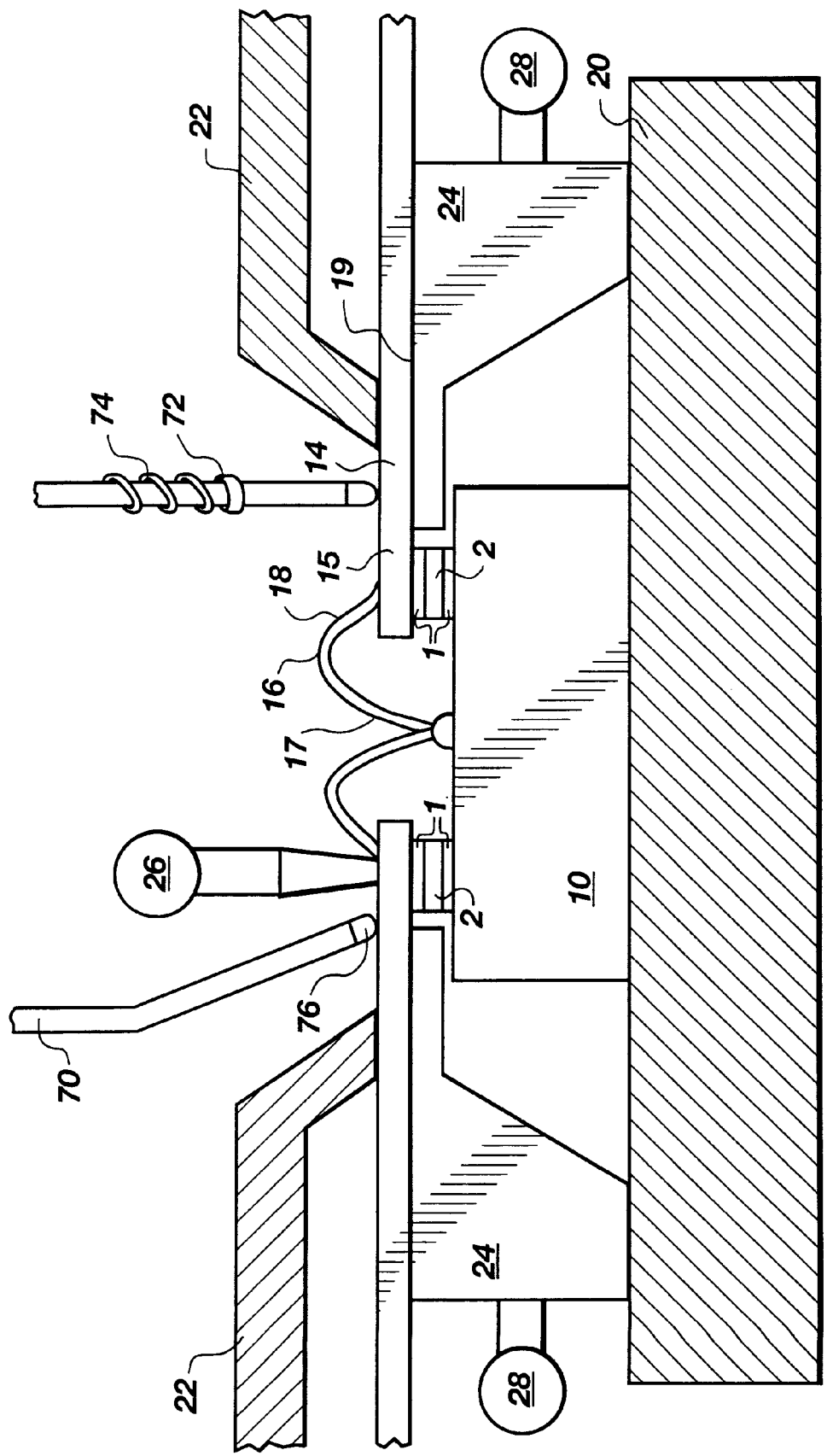
FIG. 19 is a side view of an alternative embodiment of the present invention used in the wire bonding of a semiconductor device arrangement having an LOC lead frame with the leads adhered to the semiconductor device.

Referring to drawing FIG. 19, an independently actuated lead clamp is shown in conjunction with the movable arms in order to further stabilize the lead fingers 14 of a LOC lead frame during the wire bonding process. Independently actuated lead clamp 70 may be used in place of or in addition to the conventional clamp 22 to maintain the lead finger 14 in position during the bonding process. The independent clamp 22 is the same as hereinbefore described in structure and operation to help insure that the lead finger is in contact with the movable arm 24 during the bonding process and helps minimize any deflection of the end 15 of the lead finger 14 so that the bonding apparatus 26 accurately and precisely contacts the end 15 to provide the desired wire bond. The action of independent clamp 70, and if desired the additional use of fixed clamp 22, provides improved clamping of a lead finger 14 during the wire bonding process as well as insures that the lead finger 14 of a conventional lead frame is in intimate contact with the movable arm 24 for effectiveness.

Figure 20:
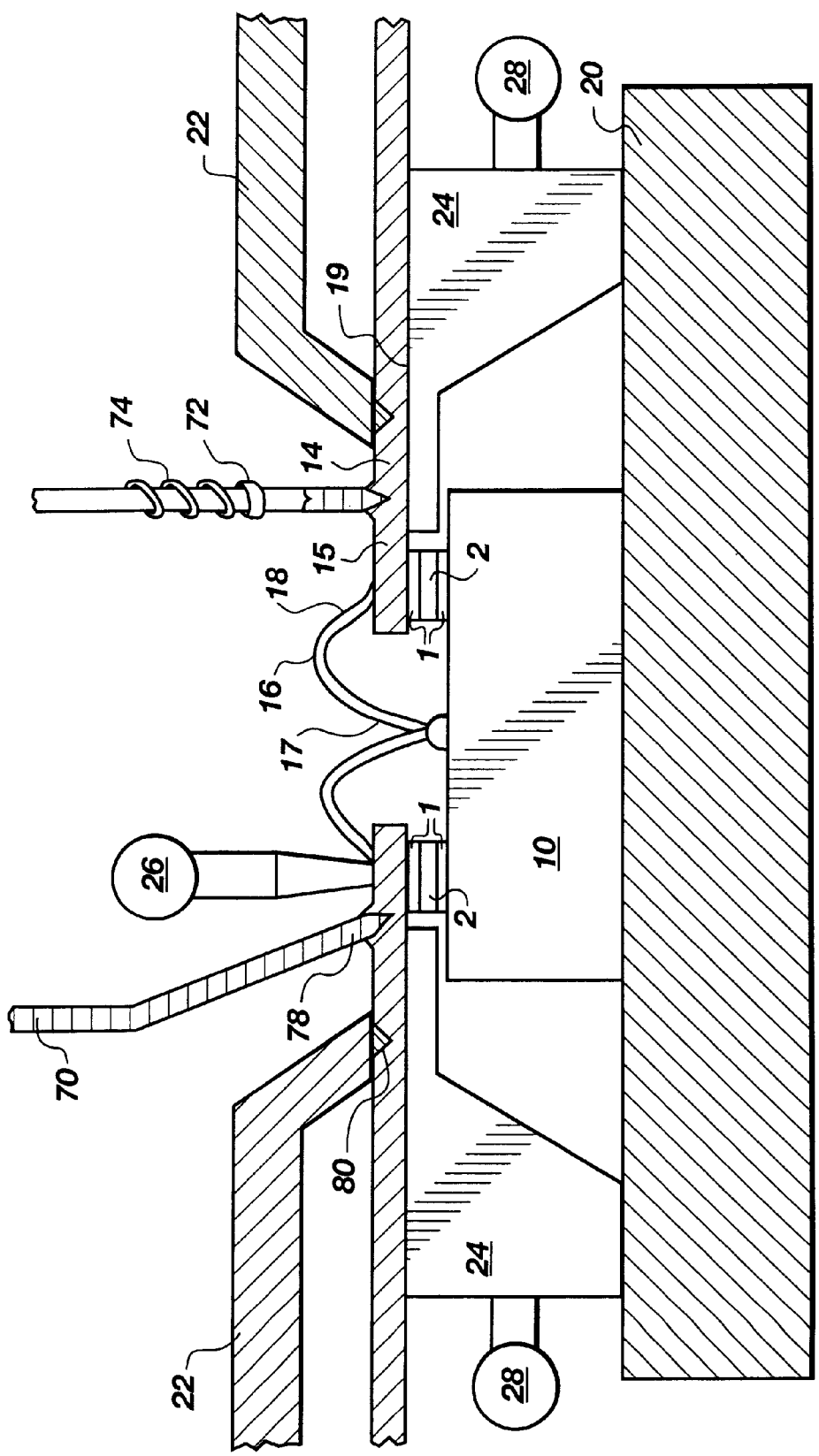
FIG. 20 is a side view of an alternative embodiment of the present invention used in the wire bonding of a semiconductor device arrangement having an LOC lead frame with the leads adhered to the semiconductor device.

Referring to drawing FIG. 20, as described hereinbefore, an independently actuated lead clamp 70 is shown having a lead finger penetrating portion 78 on the bottom thereof used in place of or in addition to the conventional clamp 22 to maintain the lead finger 14 of a LOC lead frame during the bonding process. One or more of the independent clamps 70 having penetrating portions 78 located thereon contacts and penetrates the end 15 of lead finger 14 aft of the area of the wire end 18 to the lead finger 14. The independent clamp 70 having lead penetrating portion 78 thereon may be of any suitable shape for use in independently clamping the lead finger 14, in place of the use of conventional fixed clamp 22. Also, as shown, the independent clamp 70 having lead penetrating portion 78 thereon may be resiliently mounted through the use of a shoulder 72 thereon abutting a spring 74 to control the amount of force exerted on any lead finger 14 during the wire bonding operation.

Figure 21:
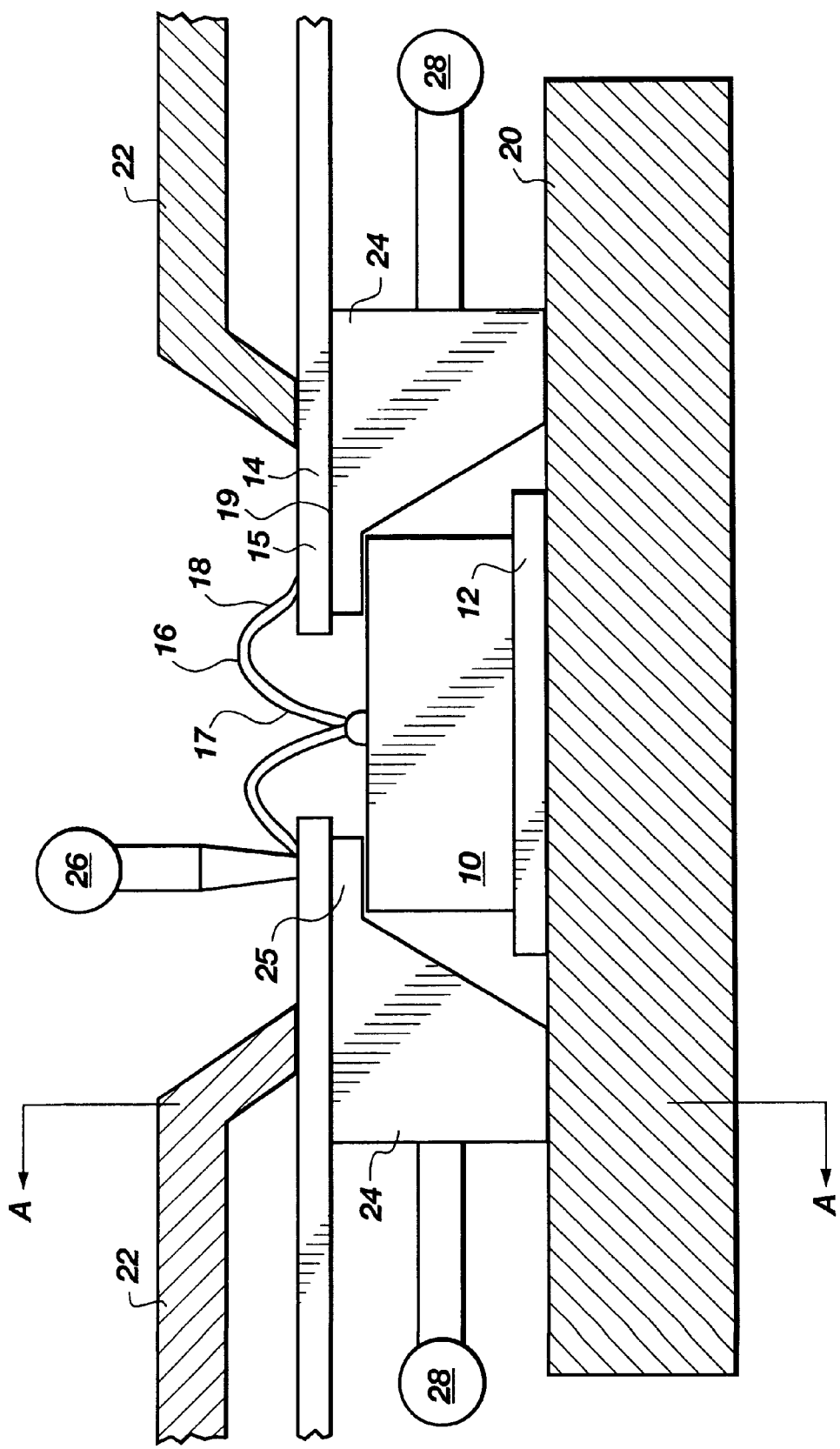
FIG. 21 is a side view of an alternative embodiment of the present invention used in the wire bonding of a semiconductor device arrangement having a two piece lead frame with the leads adhered to the semiconductor device.

Referring to drawing FIG. 21, a semiconductor chip (die) 10 is shown being supported by the paddle 12 of a two piece lead frame, such as described in U.S. Pat. No. 4,984,059. A heat block 20 is used to heat the paddle 12 and die 10 during the wire bonding process. As shown, a suitable wire 16, such as described hereinbefore, has one end thereof 17 bonded to a bond pad of the die 10. The other end 18 of the wire 16 is shown being bonded to the end 15 of a lead finger 14 of the lead frame by a suitable bonding apparatus 26. The bonding apparatus 26 may be of any suitable type well known in the bonding area, such as described hereinbefore. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. Further shown in drawing FIG. 21 is movable arm 24 having a lead support portion 25 attached to or an integral part of the movable arm 24. The movable arm 24 is dynamically attached to the heat block 20 so that the lead support portion 25 can be positioned between the die 10 and the lead fingers 14. The movable arm 24 and lead support portion 25 thus substantially prevent the application of any force against the die 10 from the bonding apparatus 26 and the clamp 22. In addition, movable arm 24 and lead support portion 25 conduct heat from the heat block 20 to the lead fingers 14. The action of movable arm 24 and lead support portion 25 provides improved support of a lead finger 14 during the wire bonding process as well as insures that the force applied by bonding apparatus 26 and clamp 22 is substantially against lead support portion 25 and movable arm 24 rather than against the die 10.

The movement of the movable arm 24 may be effectuated by various means 28, such as described hereinbefore.

The movable arm 24 is dynamically attached to the heat block 20 so that as the heat block moves into position during the wire bonding process. The movable arm 24 and lead support portion 25 move into position between the lead fingers 14 and the die 10. The movable arm 24 is shown as traveling against the heat block 20 such that the direction of travel is substantially parallel with respect to the lower surface 19 of the lead fingers 14 of a conventional lead frame.

Figure 22:
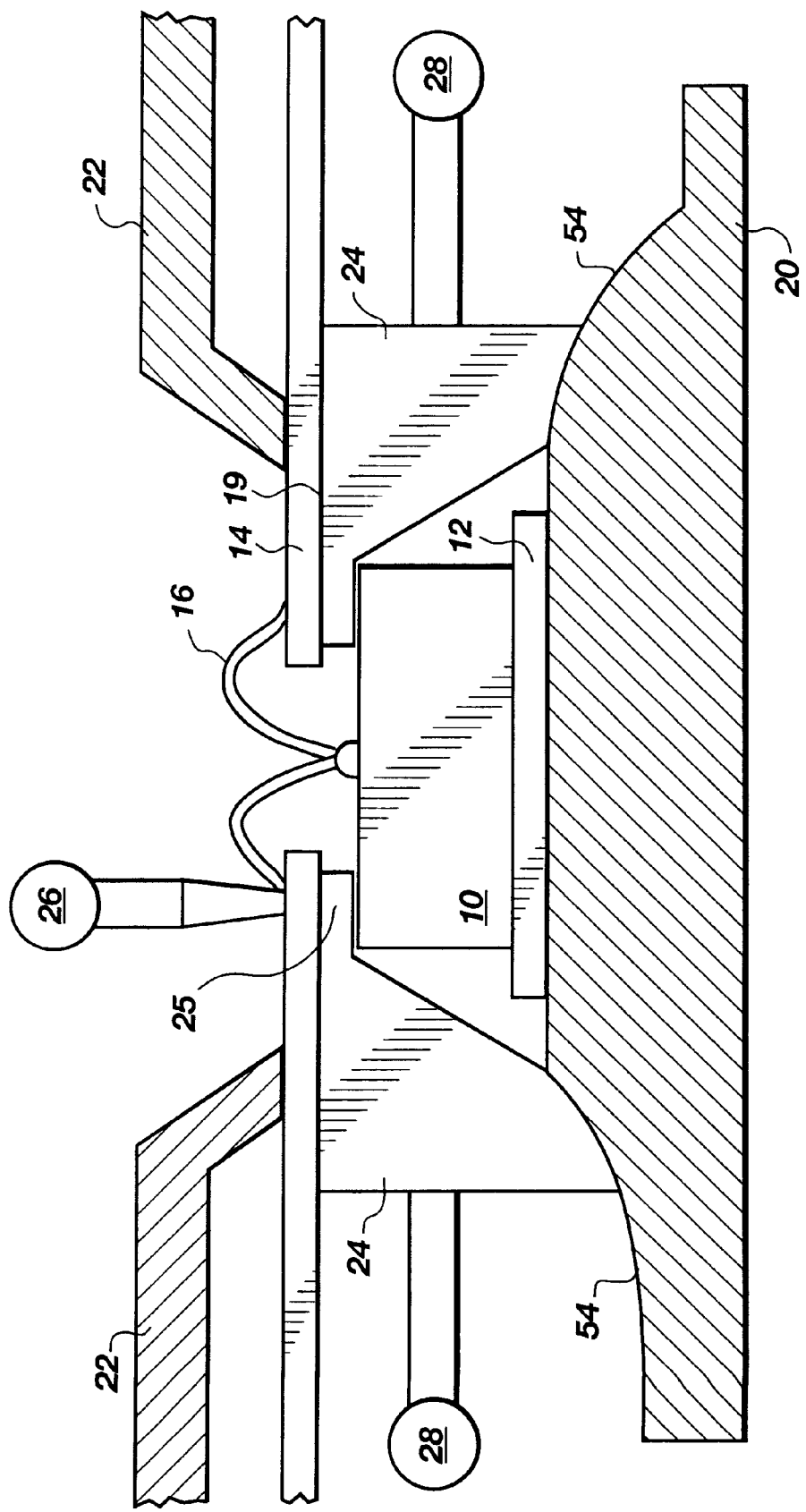
FIG. 22 is a side view of an alternative embodiment of the present invention used in the wire bonding of a semiconductor device arrangement having a two piece lead frame with the leads adhered to the semiconductor device.

Referring to drawing FIG. 22, movable arm 24 may be attached to heat block 20 such that the direction of travel with respect to lower surface 19 of lead fingers 14 is angular or arcuate. A radius 54 may be formed in heat block 20 and movable arm 24 such that the direction of travel of lead support portion 25 and movable arm 24 is arcuate with respect to lower surface 19 of the lead fingers 14 of a conventional lead frame as the lead support portion is positioned prior to wire bonding.

Figure 23:
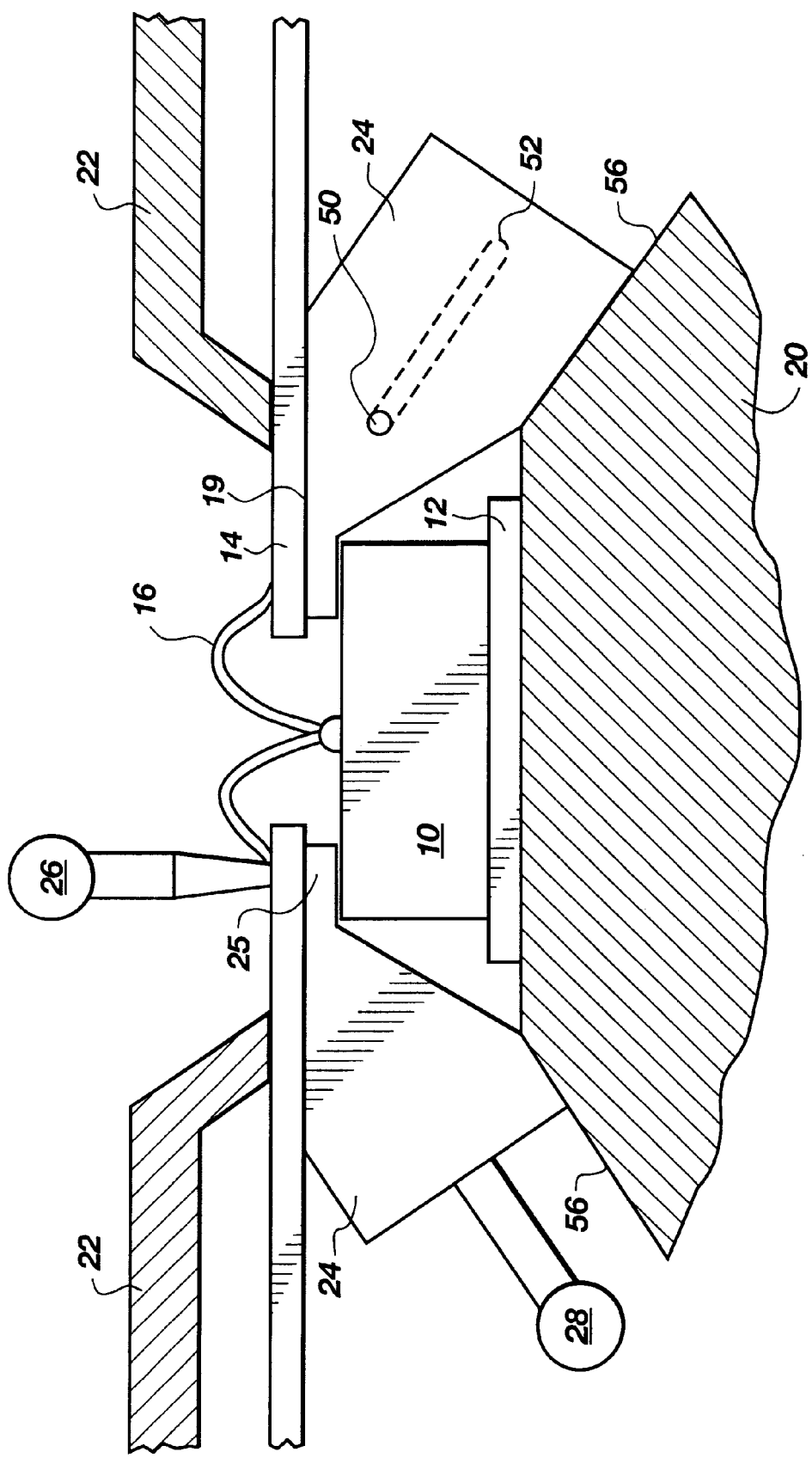
FIG. 23 is a side view of an alternative embodiment of the present invention used in the wire bonding of a semiconductor device arrangement having a two piece lead frame with the leads adhered to the semiconductor device.

Referring to drawing FIG. 23, the surface of the heat block 20 and movable arm 24 may also be angled 56 with respect to lower surface 19 of the lead fingers 14 such that the direction of travel of lead support portion 25 and movable arm 24 is angular with respect to lower surface 19 of lead fingers 14 as the lead support portion and movable arm are positioned prior to the wire bonding process.

Figure 24:
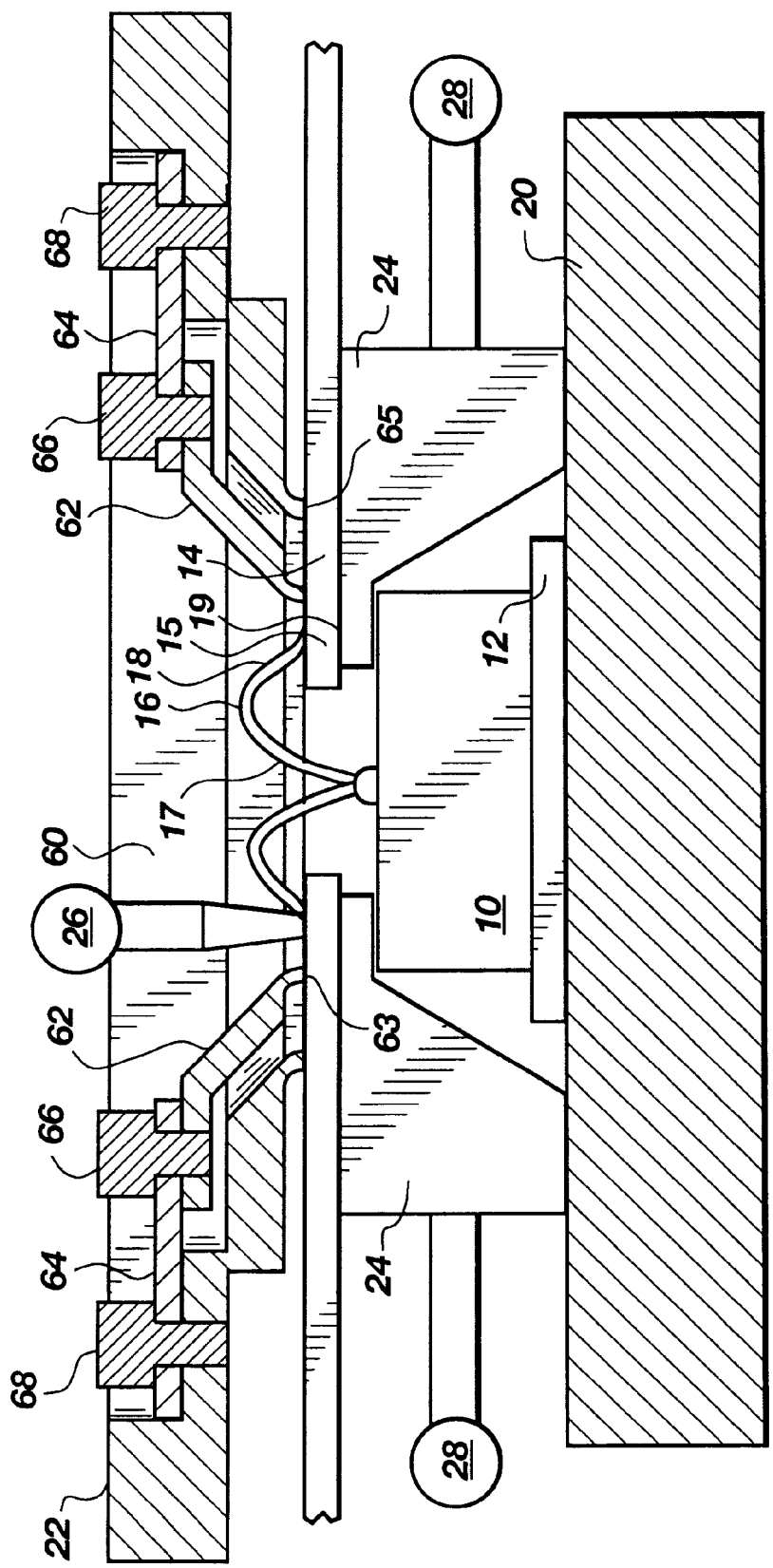
FIG. 24 is a side view of an alternative embodiment of the present invention used in the wire bonding of a semiconductor device arrangement having a two piece lead frame with the leads adhered to the semiconductor device.

The movement of the movable arm 24 and the heat block 20 may be integrated so that as the heat block moves into position it causes the movable arm to move into position. In FIG. 24, a notch 50 is shown formed in movable arm 24 and extends into a slot 52 formed in a stationary member (not shown). Thus, as the heat block 20 moves upward to contact the die 10, the heat block pushes against the movable arm 24 which is forced to travel upward and inward by the notch 50 traveling in the slot 52.

Referring to drawing FIG. 24, a dual clamp assembly is shown in conjunction with the movable arms 24 in order to further stabilize the lead fingers during the wire bonding process. The conventional clamp 22 acts as a primary clamp and includes a bond site window 60. The bond site window 60 is sized to allow access for a wire bonding apparatus 26 to a plurality of bond pads of semiconductor die 10 and to a plurality of lead fingers 14 of a conventional lead frame.

The bond site window 60 includes a secondary clamp 62 the same in construction and operation as described hereinbefore. The secondary clamp 62 is mounted to a resilient plate 64 with a first set screw or bolt 66. The proximal end of each plate 64 is attached to the conventional clamp 22 with a second set screw or bolt 68. It is, of course, understood that secondary clamp 62 can be attached to the clamp 22 in any number of known configurations, including forming the clamp 62 with an integral resilient portion which is secured to the clamp 22 or forming (for example, as by machining) the secondary clamp 62 as an integrated, resilient appendage of the clamp 22. It is, of course, also understood that any number of secondary clamps 62 can be used, consistent with the need for adequate clearances for wire bonding.

When a semiconductor die 10 and a lead frame strip including lead fingers 14 of a two piece lead frame is aligned with the bond site window 60 in the clamp 22 and pressure is exerted on the lead frame, the contact end 63 of the secondary clamp 62 contacts the movable arm 24 through lead fingers 14 extending from the lead frame over the active die surface. The secondary clamp 62 does not damage the semiconductor die 10 under the secondary clamp contact end 63 because of the resilient nature of the secondary clamp 62 and because of movable arm 24 positioned between the semiconductor die 10 and the secondary clamp 62.

The semiconductor die 10 has a two piece lead frame arrangement wherein the lead fingers 14 extend over the upper (active) semiconductor die 10. The bond site window contact lip 65 contacts the lead fingers 14 around the periphery of the semiconductor die 10. The secondary clamp 62 extends toward the center of the semiconductor die 10. A plurality of bond wires 16 is then attached between the bond pads of the semiconductor die 10 and the lead fingers 14.

The contact end 63 of the secondary clamp 62 in its unbiased state preferably extends slightly below a peripheral lead finger contact lip 65 of the bond site window 60 of the clamp 22.

Figure 25:
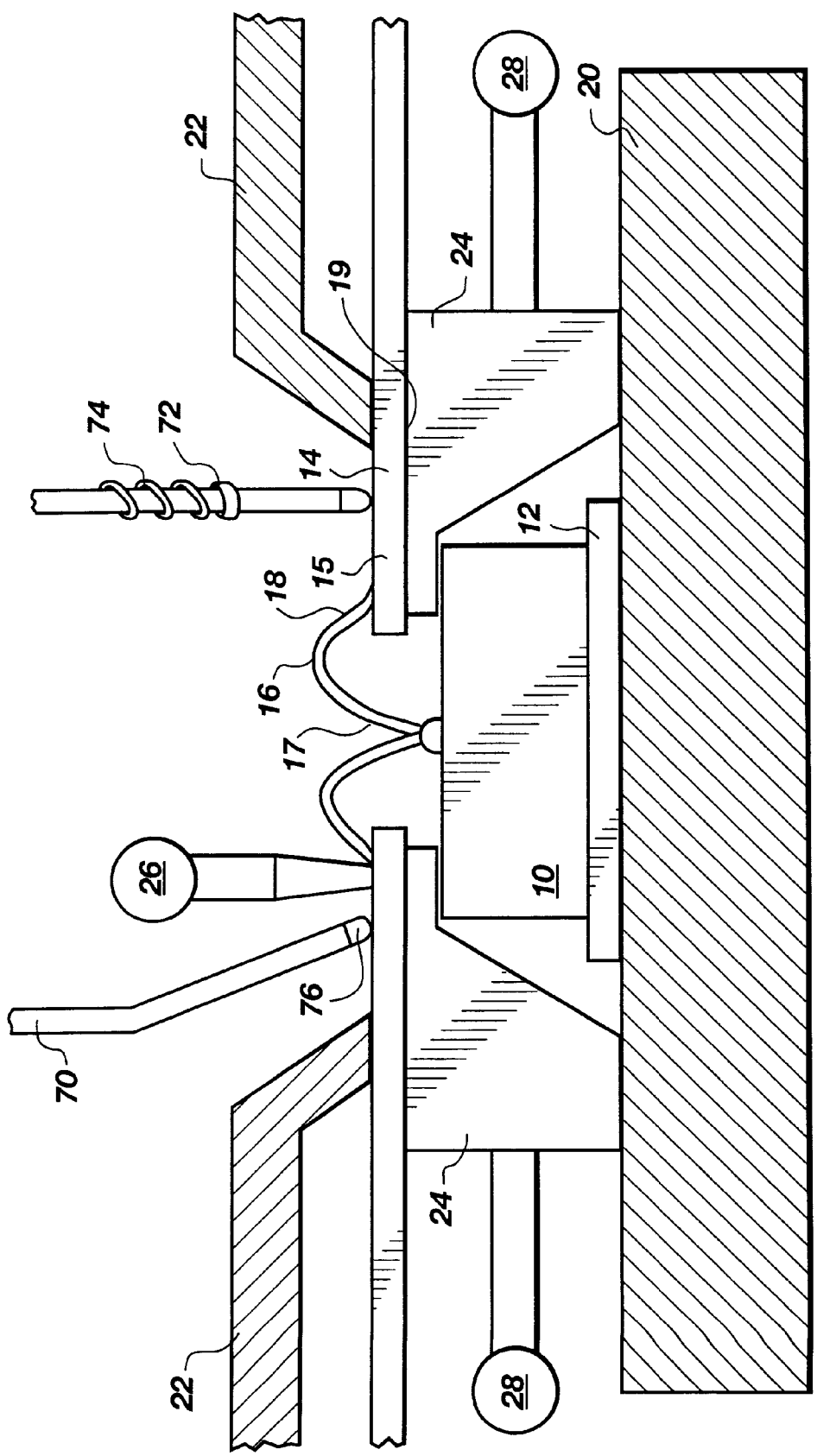
FIG. 25 is a side view of an alternative embodiment of the present invention used in the wire bonding of a semiconductor device arrangement having a two piece lead frame with the leads adhered to the semiconductor device.

Referring to drawing FIG. 25, an independently actuated lead clamp 70, such as described hereinbefore, is shown in conjunction with the movable arms 24 in order to further stabilize the lead fingers 14 of a two piece lead frame during the wire bonding process. Independently actuated lead clamp 70 may be used in place of or in addition to the conventional clamp 22 to maintain the lead finger 14 in position during the bonding process. The independent clamp 22 helps insure that the lead finger is in contact with the movable arm 24 during the bonding process and helps minimize any deflection of the end 15 of the lead finger 14 so that the bonding apparatus 26 accurately and precisely contacts the end 15 to provide the desired wire bond. The action of independent clamp 70, and if desired the additional use of fixed clamp 22, provides improved clamping of a lead finger 14 during the wire bonding process as well as insures that the lead finger 14 of a two piece lead frame is in intimate contact with the movable arm 24 for effectiveness.

Independent clamp 70 may be of any suitable shape for use in independently clamping the lead finger 14, in place of the use of conventional fixed clamp 22. Also, the independent clamp 70 may be resiliently mounted through the use of a shoulder 72 thereon abutting a spring 74 to control the amount of force exerted on any lead finger 14 during the wire bonding operation. If desired, the independent clamp 70 may include insulation or cushioning 76 on the end thereof.

During the bond operation, one or more of the independent clamps 70 clamps the end 15 of lead finger 14 of a two piece lead frame prior to the bonding of a wire 16 thereto by one or more of the bonding apparatus 26. The independent clamp 70 applies sufficient pressure to the end 15 of lead finger 14 to press the lead finger 14 against moveable arm 24 to insure a satisfactory bond between the end 18 of any wire 16 and the end 15 of the lead finger 14.

As shown, one, or more, of the independent clamps 70 contacts the end 15 of lead finger 14 aft of the area of the wire end 18 to the lead finger 14. The bonds of the wire end 18 to the end 15 of the lead finger 14 are typically a wedge type wire bond, although a ball bond may be made if desired. As shown, the heat block 20 is in contact with the paddle 12 and the movable arm 24, which, in turn, is in contact with the lead fingers 14.

The independent lead clamp 70 may have a modified end or foot thereon to provide a larger clamping area of the clamp 70 on the end 15 of the lead finger 14 during bonding operations. The modified end or foot may be substantially the same width as the lead finger 14 of a conventional lead frame and may be mounted to have articulated movement about the end of the independent clamp 70, such as using a pin extending through suitable apertures in a pair of ears attached to the foot.

The independent clamp 70 may be integrally attached to the clamp 22 or may have an articulated mounting arrangement. The modified end or foot may be generally semicircular, or arcuate, in configuration so as to engage a large portion of the end 15 of the lead finger 14 of a conventional lead frame surrounding the bonding apparatus 26 during the wire bonding operation to hold the end 15 in position.

The independent clamp 70 may also be used in conjunction with a second independently actuated clamp. The second independently actuated clamp may be of any suitable type and structure such as described and illustrated hereinbefore. The clamp 70 and the second clamp may be actuated independently of each other and independently of the bonding apparatus 26 as described and illustrated hereinbefore.

Figure 26:
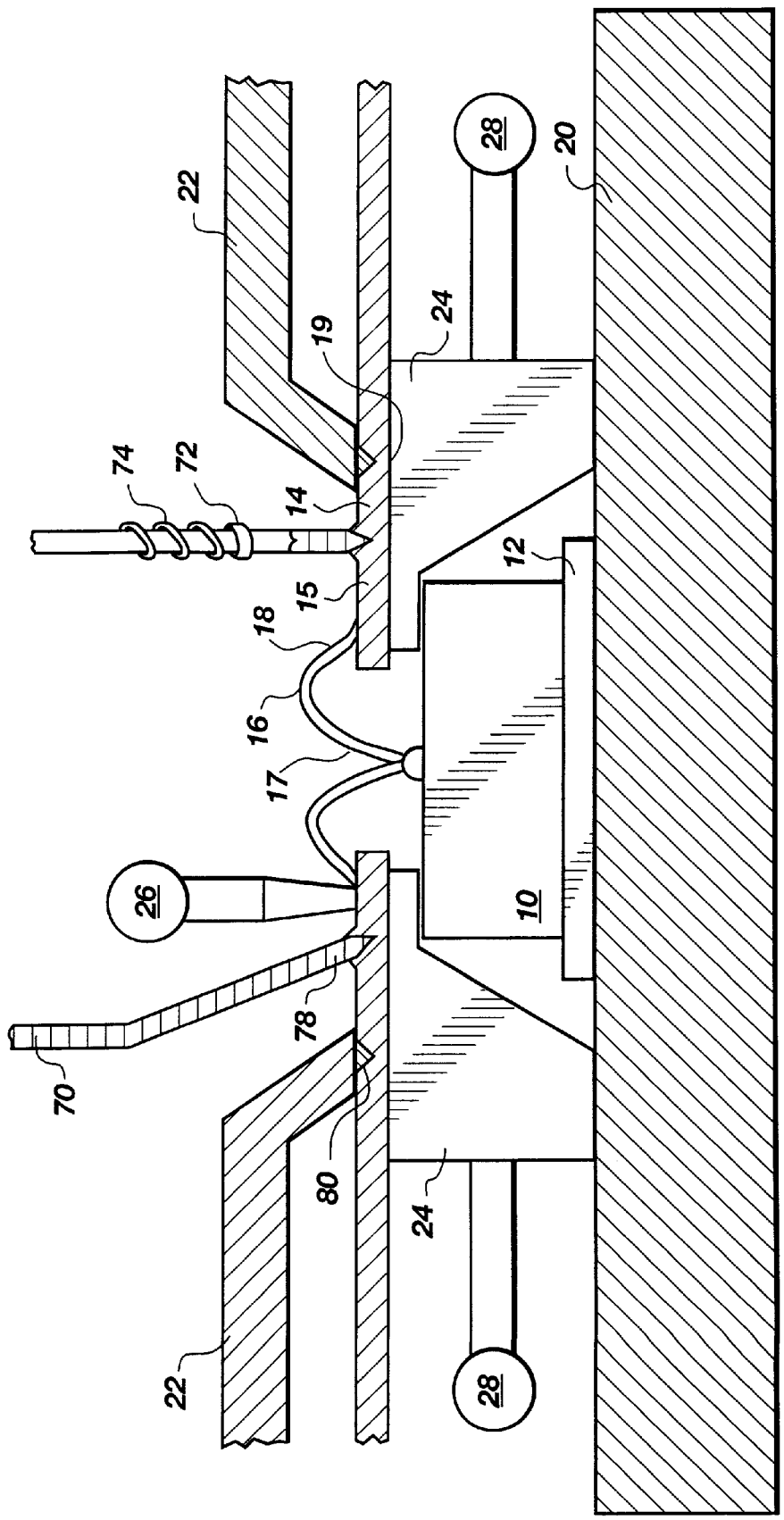
FIG. 26 is a side view of an alternative embodiment of the present invention used in the wire bonding of a semiconductor device arrangement having a two piece lead frame with the leads adhered to the semiconductor device.

Referring to drawing FIG. 26, an independently actuated lead clamp 70, such as described hereinbefore, is shown having a lead finger penetrating portion 78 on the bottom thereof used in place of or in addition to the conventional clamp 22 to maintain the lead finger 14 of a two-piece lead frame during the bonding process. One or more of the independent clamps 70 having penetrating portions 78 located thereon contacts and penetrates the end 15 of lead finger 14 aft of the area of the wire end 18 bonded to the lead finger 14. The independent clamp 70 having lead penetrating portion 78 thereon may be of any suitable shape for use in independently clamping the lead finger 14, in place of the use of conventional fixed clamp 22. Also, as shown, the independent clamp 70 having lead penetrating portion 78 thereon may be resiliently mounted through the use of a shoulder 72 thereon abutting a spring 74 to control the amount of force exerted on any lead finger 14 during the wire bonding operation. As described hereinbefore, the independent clamp 70 having lead penetrating portion 78 thereon is actuated independently of bonding apparatus 26 and has the capability of independent movement along the x-axis, y-axis and z-axis with respect to the bonding apparatus 26. The independent clamp 70 having lead penetrating portion 78 thereon is also free to move about the bonding apparatus 26 and the central axis of the die 10 so that any lead finger 14 of a conventional lead frame that is to be connected to a bond pad on the die 10, regardless of location, may be accommodated. The independent clamp 70 having lead penetrating portion 78 thereon does not need to be, and preferably is not, concentrically centered about the bonding apparatus 26 so that it will not interfere with the operation thereof. Any desired number of independent clamps 70 having lead penetrating portion 78 thereon may be used about the bonding apparatus to minimize the amount of movement of the independent clamp 70 between wire bonding operations. Also, the independent clamps 70 may be located in quadrants about the die 10, or in any manner as desired.

The independently actuated lead clamp has a lead finger penetrating portion 78 on the bottom thereof used in place of or in addition to the conventional clamp 22 to maintain the lead finger 14 in position during the bonding process. Such independent clamp 70 helps insure that the lead finger 14 is in contact with the moveable arm 24 during the bonding process, immobilizes the lead finger 14 during the wire bonding process, and helps minimize any deflection of the end 15 of the lead finger 14 so that the bonding apparatus 26 accurately, precisely contacts the end 15 to provide the desired wire bond. The action of such independent clamp 70, and, if desired the additional use of fixed clamp 22, provides improved clamping and immobilization of a lead finger 14 during the wire bonding process as well as insures that the lead finger 14 is in intimate contact with the moveable arm 24 for effectiveness.

During the wire bonding process, it is desirable for the heat block to be heated as previously described hereinbefore. Similarly, the bonding apparatus should exert substantially the same amount of force as described hereinbefore.

During the bond operation, one or more of the independent clamps 70 having a lead finger penetrating portion 78 located on the end thereof clamps the end 15 of lead finger 14 prior to the bonding of a wire 16 thereto by one or more of the bonding apparatus 26. The independent clamp 70 applies sufficient pressure to the end 15 of the lead finger 14 to insure a satisfactory bond between the end of any wire 16 and the end 15 of the lead finger 14.

As shown, one or more of the independent clamps 70 contacts the end 15 of lead finger 14 aft of the area of the wire end 18 bonded to the lead finger 14. The bonds of the wire end 18 to the end 15 of the lead finger 14 are typically a wedge type wire bond, although a ball bond may be made if desired. As shown, the heat block 20 is in contact with the paddle 12 of the lead frame. The lead fingers 14 of a two piece lead frame are in contact with the movable arm 24 which, in turn, is in contact with the heat block 20.

As also shown, the fixed clamps 22 are formed to have a penetrating portion 80 thereon which penetrates the end 15 of lead finger 14 of a conventional lead frame. In this manner, the fixed clamp 22 provides improved clamping and immobilization of a lead finger 14 during the wire bonding process as well as insures that the lead finger 14 is in intimate contact with the movable arm 24 for effectiveness. As shown, the clamps 22 and 70 having lead finger penetrating portions thereon cause the lead finger 14 to engage the movable arm 24 with the movable arm being in contact with the heat block 20. However, care should be taken to prevent the lead penetrating portion 78 of the clamp 70 from either damaging the lead finger 14, affecting its electrical characteristics, or severing the lead finger 14.

The independent lead clamp 70 may be formed having a modified end or foot thereon to provide a larger clamping area of the clamp 70 on the end 15 of the lead finger 14 during bonding operations as described hereinbefore. It should be understood that any of the penetrating clamps hereinbefore described may act on the opposite side of the lead clamp 22 during the wire bonding operations regarding a lead finger 14. It is not necessary that the penetrating clamp be positioned on the same side of the lead finger 14 as the bonding apparatus 26.

Figure 27:
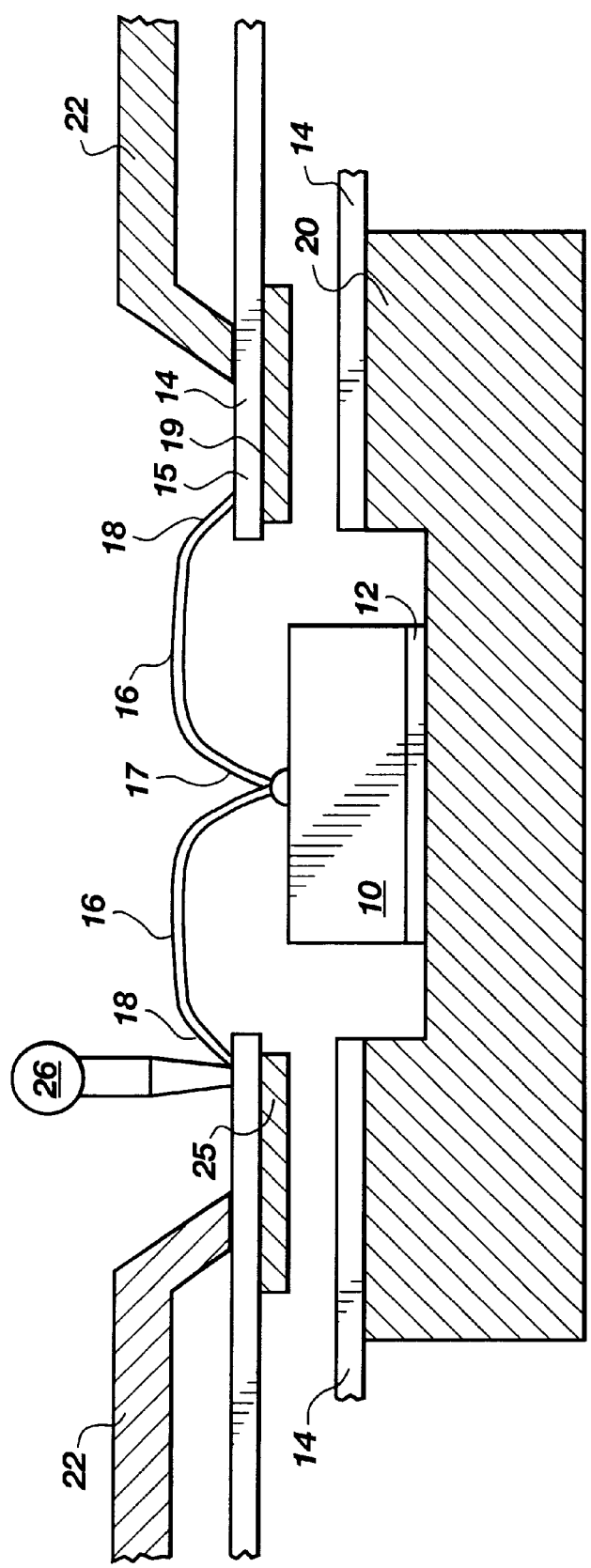
FIG. 27 is a side view of an alternative embodiment of the present invention used in the wire bonding of a semiconductor device arrangement having a hybrid lead frame with leads on differing levels.

Referring to drawing FIG. 27, a semiconductor device (die) 10 is shown being supported by the paddle 12 of a hybrid lead frame having lead fingers 14 located on differing levels with respect to the semiconductor device 10. That is, a portion of the lead fingers is located on a first level with respect to the lead frame and another portion of the lead fingers is located on a second level with respect to the lead frame. The portion of the lead fingers 14 of the lead frame are supported by heat block 20 during the bonding operation while the other portion of lead fingers 14 is supported by the lead support portion 25 of movable arm 24 during the wire bonding operations. A heat block 20 is used to heat the paddle 12 and die 10 during the wire bonding process. As shown, a suitable wire 16, such as described hereinbefore, has one end thereof 17 bonded to a bond pad of the die 10. The wire 16 may be of any suitable type for connection and bonding purposes as described hereinbefore. The other end 18 of the wire 16 is shown being bonded to the end 15 of a lead finger 14 of the lead frame by a suitable bonding apparatus 26. The bonding apparatus 26 may be of any suitable type well known in the bonding area as described hereinbefore. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. As shown in drawing FIG. 28, movable arm 24 having a lead support portion 25 is attached to or an integral part thereof. The movable arm 24 is dynamically attached to the heat block 20 so that the lead support portion 25 can be positioned under a portion of the lead fingers 14. The movable arm 24 and lead support portion 25 thus allow for improved wire bonding to the elevated lead fingers 14 of the hybrid lead frame. In addition, movable arm 24 having lead support portion 25 conducts heat from the heat block 20 to the lead fingers 14.

The movement of the movable arm 24 may be effectuated by various means 28, such as described hereinbefore. The movable arm 24 is dynamically attached to the heat block 20 so that as the heat block moves into position during the wire bonding process, the movable arm 24 having lead support portion 25 moves into position under a portion of the lead fingers 14.

Figure 28:
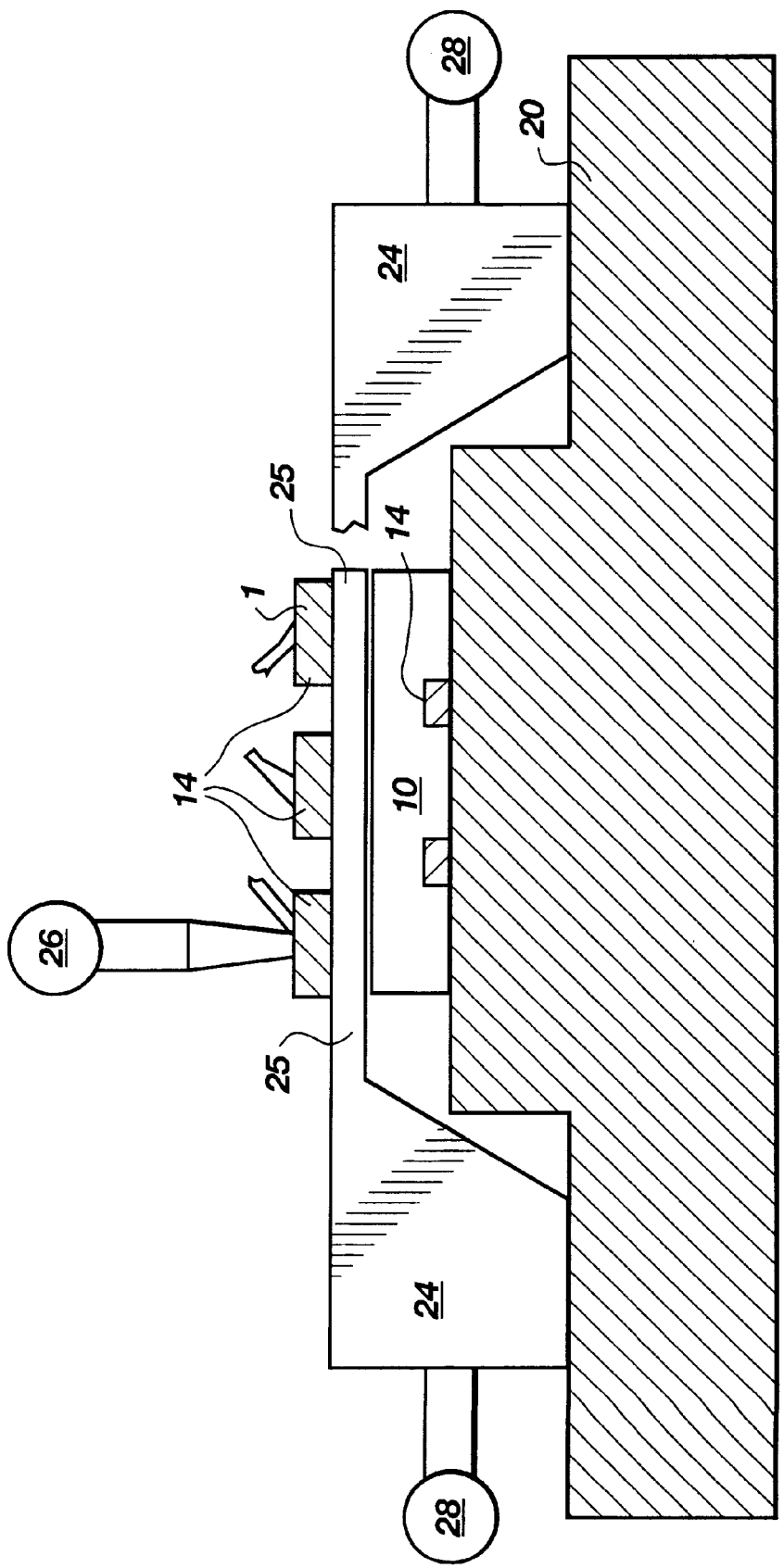
FIG. 28 is a view of the alternative embodiment of the present invention illustrated in drawing FIG. 27 with the alternative embodiment rotated ninety degrees (90°) to illustrate the lead support for the lead fingers of the hybrid lead frame.

Referring to drawing FIG. 28, the movable arm 24 is shown in relation to the semiconductor device 10 and lead fingers 14 of the hybrid lead frame. As illustrated, the heat block 20 supports the lower level or first portion of lead fingers 14 during wire bonding operations while the lead support portion 25 of the movable arm 24 supports the upper level or other portion of the lead fingers 14 during wire bonding operations by wire bonding apparatus 26.

METHOD OF BONDING

Referring to drawing FIGS. 1, 4 and 5, in the method of the present invention, a die 10 is positioned within the bonding area of the bonding apparatus 26. A movable arm 24 having a lead support portion 25 is positioned such that the lead support portion 25 is between the die 10 and the lead fingers 14. A clamp 22 serves to help straighten the lead frame and position the lead fingers 14 during subsequent bonding operations. Next, the die 10 and the lead fingers 14 are heated to the desired temperature before bonding operations by the heat block 20 acting through movable and/or adjustable arm 24. The wire bonding apparatus 26 is then actuated to form a wire bond on end 17 of wire 16 to an appropriate bond pad on die 10. After the formation of the bond of end 17 of wire 16 to the bond pad of die 10, the bonding apparatus is moved to appropriate end 15 of lead finger 14 for the formation of a suitable wire bond thereto by end 18 of wire 16. During this process, lead support portion 25 of movable and/or adjustable arm 24 acts to substantially oppose the application of force from the bonding apparatus 26 and clamp 22 and to stabilize the lead fingers 14. After the wire 16 has been bonded to the desired bond pad of die 10 and end 15 of lead finger 14, the process is repeated until all desired wire bonds between lead fingers 14 and bond pads of die 10 are completed.

Referring to drawing FIG. 6, if desired to have additional clamping of the lead finger 14, a secondary clamp 62 and a conventional clamp 22 may be used with the bonding apparatus 26. The secondary clamp 62 may be actuated and moved from the lead finger 14 with, before or after the removal of the bonding apparatus 26 from the lead finger.

Referring to drawing FIG. 7, if desired to have additional clamping of the lead finger 14, either a fixed clamp 22 and/or a second independent clamp 70 may be used with the bonding apparatus 26. The second independent clamp 70 may be actuated and moved from the lead finger 14 with, before or after the removal of the bonding apparatus 26 from the lead finger.

Referring to drawing FIG. 8, if desired to have additional clamping of the lead finger 14, either a fixed clamp 22 and/or a second independent clamp 70 having a penetrating portion 78 thereon may be used with the bonding apparatus 26. The second independent clamp 70 may be actuated and moved from the lead finger 14 with, before or after the removal of the bonding apparatus 26 from the lead finger. It will be understood that the alternative embodiments of the present invention shown in the other drawing figures corresponding to those described hereinabove are wire bonded in a similar fashion.

Figure 29:
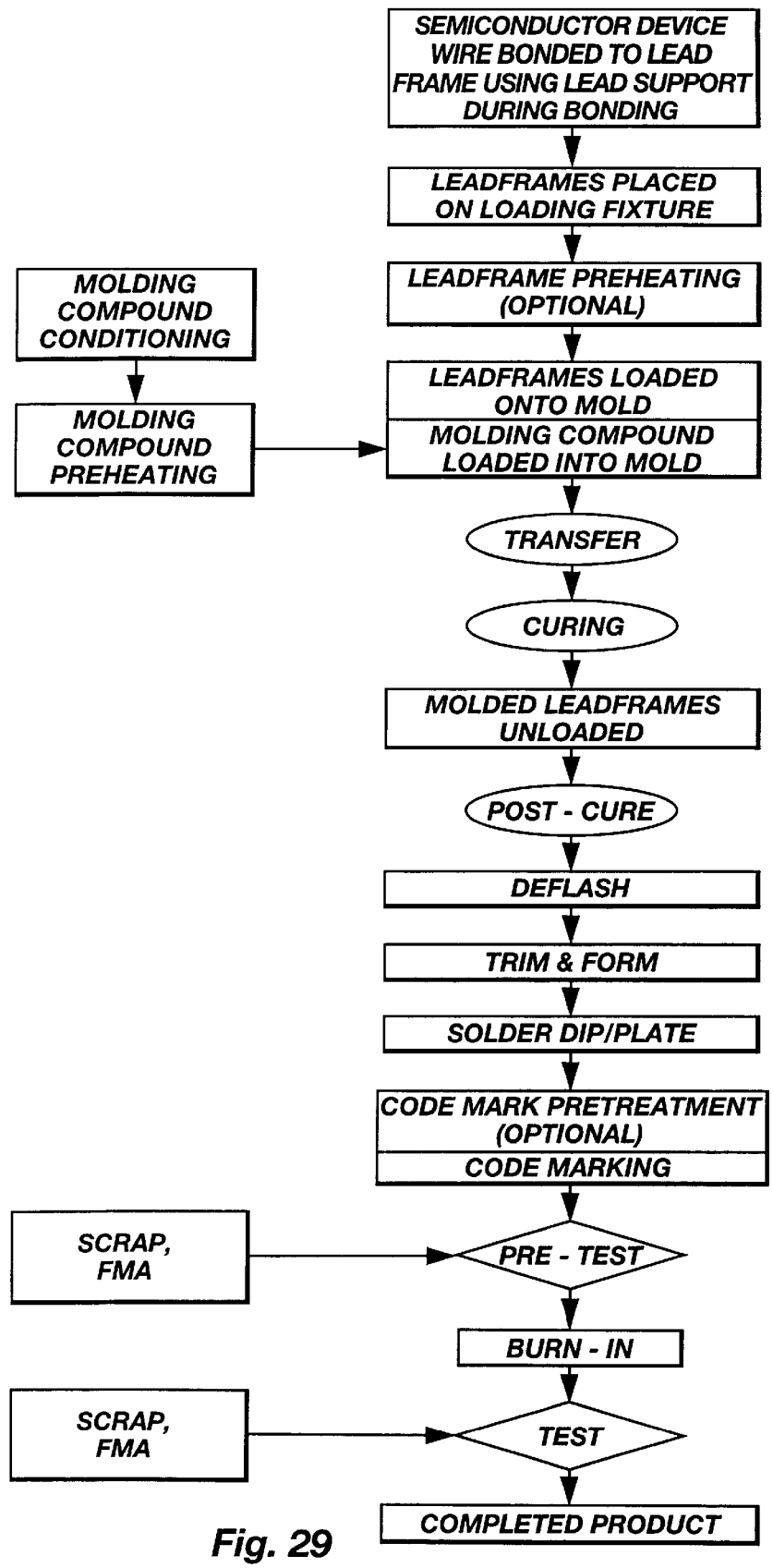
FIG. 29 comprises a flow chart of an exemplary process sequence for plastic package molding of a semiconductor device wire bonded to a lead frame using the lead support of the present invention.

FIG. 29 is a flow chart of a typical process sequence for plastic package molding of a semiconductor device wirebond to a lead frame by the use of a lead support portion 25 of arm 24 according to the present invention. It should be noted that the solder dip/plate operation has been shown as one step for brevity; normally plating would occur prior to trim and form.

Figure 30:
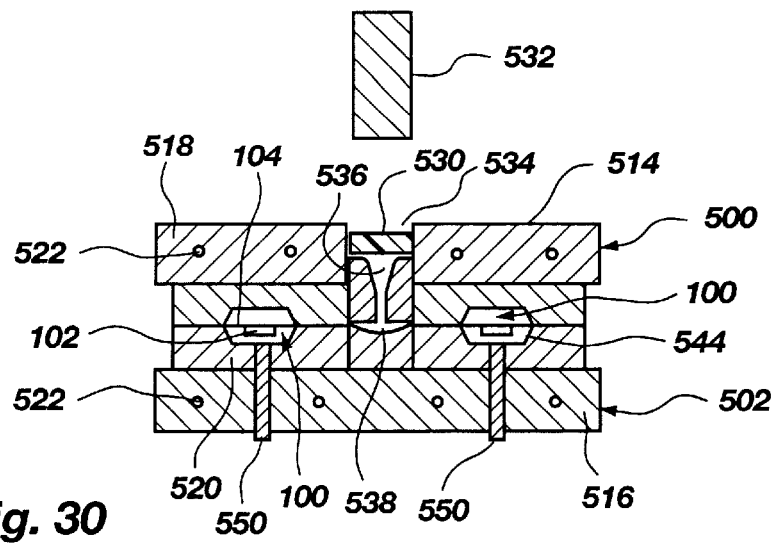
FIG. 30 is a side schematic view of a typical transfer mold illustrating a pre-molding encapsulant position.
Figure 31:
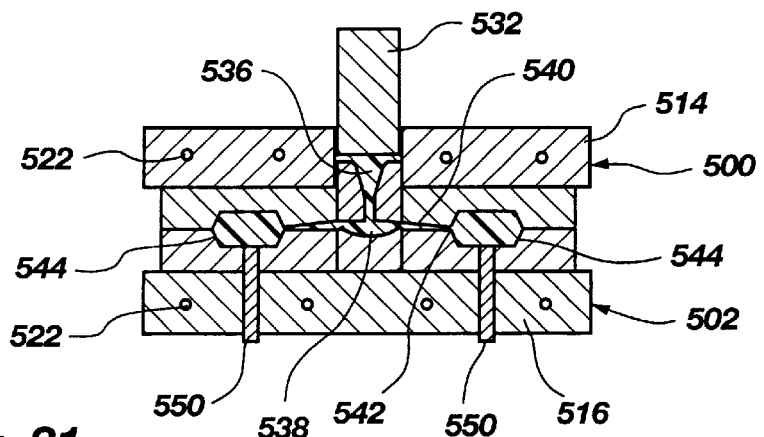
FIG. 31 is a side schematic view of a typical transfer mold illustrating a post-molding encapsulant position.

FIGS. 30 and 31 show pre-molding and post-molding positions of encapsulant during a transfer molding operation using a typical mold apparatus comprising upper and lower mold halves 500 and 502, each mold half including a platen 514 or 516 with its associated chase 518 or 520. Heating elements 522 are employed in the platens to maintain an elevated and relatively uniform temperature in the runners and mold cavities during the molding operation. FIG. 30 shows a top view of one side of the transfer mold apparatus of FIGS. 28 and 29. In the transfer mold apparatus shown, the encapsulant flows into each mold cavity 544 through the short end thereof.

Figure 32:
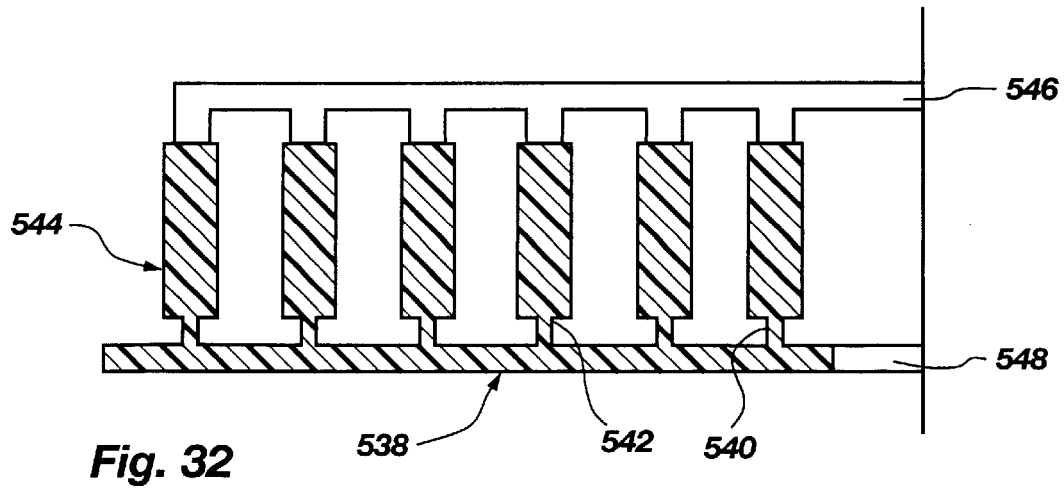
FIG. 32 illustrates a top schematic view of one side of a transfer mold of FIGS. 28 and 29 depicting encapsulant flow and venting of the primary mold runner and the mold cavities wherein the die assemblies are contained.

In operation, a heated pellet of resin mold compound 530 is disposed beneath ram or plunger 532 in pot 534. The plunger descends, melting the pellet and forcing the melted encapsulant down through sprue 536 and into primary runner 538, from which it travels to transversely-oriented secondary runners 540 and across gates 542 into and through the mold cavities 544 through the short side thereof flowing across the die assemblies 100, wherein die assemblies 100 comprising dies 102 with attached lead frames 104 are disposed (usually in strips so that a strip of six lead frames, for example, would be cut and placed in and across the six cavities 544 shown in FIG. 32). Air in the runners 538 and 540 and mold cavities 544 is vented to the atmosphere through vents 546 and 548. At the end of the molding operation, the encapsulant is "packed" by application of a higher pressure to eliminate voids and reduce non-uniformities of the encapsulant in the mold cavities 544. After molding, the encapsulated die assemblies are ejected from the cavities 544 by ejector pins 550, after which they are post-cured at an elevated temperature to complete cross-linking of the resin, followed by other operations as known in the art and set forth in FIG. 29 by way of example. It will be appreciated that other transfer molding apparatus configurations, as well as variations in the details of the described method are known in the art. However, none of such are pertinent to the invention, and so will not be discussed herein.

Figure 33:
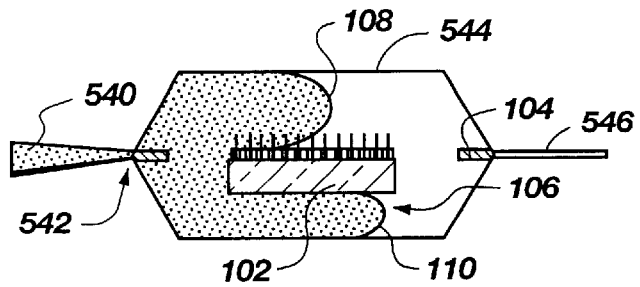
FIG. 33 depicts a first encapsulant flow scenario for a mold cavity during molding a lead frame and semiconductor manufactured using the present invention of a lead bonding support.
Figure 34:
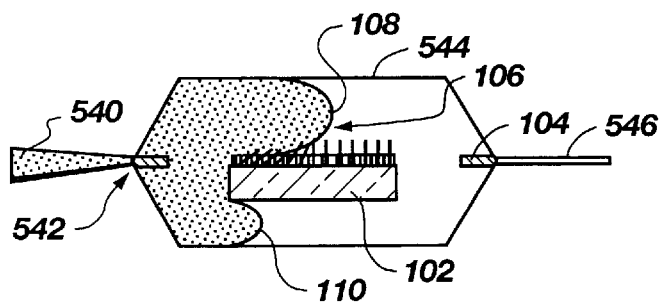
FIG. 34 depicts a second encapsulant flow scenario for a mold cavity during molding a lead frame and semiconductor manufactured using the present invention of a lead bonding support.
Figure 35:
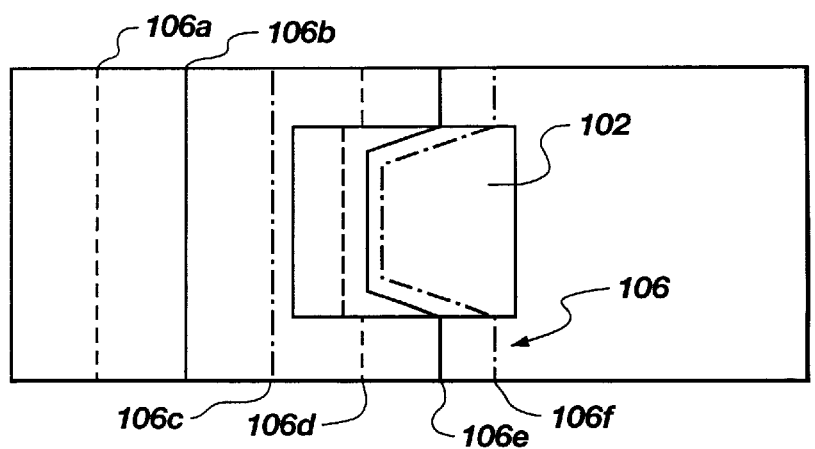
FIG. 35 depicts a third encapsulant flow scenario for a mold cavity during molding a lead frame and semiconductor manufactured using the present invention of a lead bonding support.

Encapsulant flow in the mold cavities 544 is demonstrably non-uniform. The presence of the die assembly 100 comprising a die 102 with lead frame 104 disposed across the mid-section of a cavity 544 splits the viscous encapsulant flow front 106 into upper 108 and lower 110 components. Further, the presence of the (relatively) large die 102 with its relatively lower temperature in the middle of a cavity 544 permits the flow front 106 on each side of the die 102 to advance ahead of the front which passes over and under the die 102. FIGS. 33 and 34 show two mold cavity encapsulant flow scenarios where, respectively, the lower flow front 110 and the upper flow front 108 lead the overall encapsulant flow front 106 in the cavity 544 containing the die assembly 100. FIG. 35 depicts the advance of a flow front 106 from above, before and after a die 102 is encountered, the flow being depicted as time-separated instantaneous flow fronts 106a, 106b, 106c, 106d, 106e and 106f.

It will be understood that the present invention may have changes, additions, deletions, modifications, and a different sequence of operation which fall within the scope of the invention. For instance, the lead support portion may be actuated in various directions with respect to the semiconductor device during the wire bonding process. The lead support portion may be segmented or in multiple pieces, etc.

What is claimed is:

1. A clamp assembly for stabilizing at least one lead finger of a lead frame during a wire bonding process, said clamp assembly comprising:

a primary clamp having at least one bond site window extending therethrough for receiving a semiconductor device having a periphery to be wire bonded to said at least one lead finger of said lead frame, said primary clamp having at least one surface for contacting a first surface of said at least on lead finger of said lead frame outside of the periphery of said semiconductor device;

at least one resiliently-biased secondary clamp extending over said at least one bond site window to contact said first surface of at least one of said lead fingers of said lead frame; and a support arm for contacting a second surface of said at least one lead finger of said lead frame at a position opposite said primary clamp and said secondary clamp.

2. The clamp assembly of claim 1, wherein said secondary clamp includes a resilient portion and a non-deformable portion, the non-deformable portion contacting said at least one of said lead fingers of said lead frame.

3. The clamp assembly of claim 2, wherein at least one of said resilient portion and said contact portion comprises stainless steel.

4. The clamp assembly of claim 1, wherein said secondary clamp is structured to impart sufficient force to said at least one lead finger of said lead frame during said wire bonding process.

5. The clamp assembly of claim 1, wherein said secondary clamp configured to contact said at least one lead finger of said lead frame substantially preventing movement thereof during wire bonding.

6. The clamp assembly of claim 1, wherein said at least one secondary clamp comprises a pair of secondary clamps extending over said bond site window from opposing sides thereof.

7. The clamp assembly of claim 1, wherein said at least one secondary clamp is arranged to contact at least one lead finger of said lead frame having a portion extending substantially over said semiconductor device.

8. The clamp assembly of claim 1, wherein said at least one secondary clamp configured to contact said at least one lead finger of said lead frame adjacent the periphery of said semiconductor device.

9. The clamp assembly of claim 1, wherein said at least one secondary clamp comprises a plurality of secondary clamps, at least one of said plurality of secondary clamps being configured to contact said at least one lead finger of said lead frame having a portion extending over said semiconductor device and another clamp of said plurality of secondary clamps being configured to contact said at least one lead finger of said lead frame adjacent the periphery of said semiconductor device.

10. The clamp assembly of claim 1, wherein said at least one secondary clamp is resiliently biased.

11. A clamp assembly for stabilizing at least one lead finger of a lead frame during a wire bonding process, said clamp assembly comprising:
- a primary clamp having at least one bond site window extending therethrough for receiving a semiconductor device having a periphery to be wire bonded to said at least one lead finger of said lead frame, said primary clamp having at least one surface for contacting a first surface of said at least on lead finger of said lead frame outside of the periphery of said semiconductor device;
- at least one secondary clamp extending over said at least one bond site window to contact said first surface of at least one of said lead fingers of said lead frame; and
- a support arm for contacting a second surface of said at least one lead finger of said lead frame at a position opposite said primary clamp and said secondary clamp.

12. The clamp assembly of claim 11, further comprising:
- at least one resiliently-biased secondary clamp extending over said at least one bond site window to contact said first surface of at least one of said lead fingers of said lead frame.

13. The clamp assembly of claim 12, wherein said secondary clamp includes a resilient portion and a non-deformable portion, the non-deformable portion contacting said at least one of said lead fingers of said lead frame.

14. The clamp assembly of claim 13, wherein at least one of said resilient portion and said contact portion comprises stainless steel.

15. The clamp assembly of claim 12, wherein said secondary clamp is structured to impart sufficient force to said at least one lead finger of said lead frame during said wire bonding process.

16. The clamp assembly of claim 12, wherein said secondary clamp configured to contact said at least one lead finger of said lead frame substantially preventing movement thereof during wire bonding.

17. The clamp assembly of claim 12, wherein said at least one secondary clamp comprises a pair of secondary clamps extending over said bond site window from opposing sides thereof.

18. The clamp assembly of claim 12, wherein said at least one secondary clamp is arranged to contact at least one lead finger of said lead frame having a portion extending substantially over said semiconductor device.

19. The clamp assembly of claim 12, wherein said at least one secondary clamp configured to contact said at least one lead finger of said lead frame adjacent the periphery of said semiconductor device.

20. The clamp assembly of claim 12, wherein said at least one secondary clamp comprises a plurality of secondary clamps, at least one of said plurality of secondary clamps being configured to contact said at least one lead finger of said lead frame having a portion extending over said semiconductor device and another clamp of said plurality of secondary clamps being configured to contact said at least one lead finger of said lead frame adjacent the periphery of said semiconductor device.

21. The clamp assembly of claim 12, wherein said at least one secondary clamp is resiliently biased.

* * * * *

UNITED STATES PATENT AND TRADEMARK OFFICE
CERTIFICATE OF CORRECTION

| | |
|---|---|
| PATENT NO. | : 6,267,287 B1 |
| APPLICATION NO. | : 09/358309 |
| DATED | : July 31, 2001 |
| INVENTOR(S) | : Michael B. Ball |

It is certified that error appears in the above-identified patent and that said Letters Patent is hereby corrected as shown below:

In the section number (62)
Related U.S. Application Data:
    LINE 5,                                  change "Jun. 7, 1996," to
                                                  --Jun. 17, 1996--

In the drawings:
    In FIG. 17,                  redirect the lead line extending from reference numeral 25 to the left in order to indicate the upper central portion of structure 24 (as shown below)

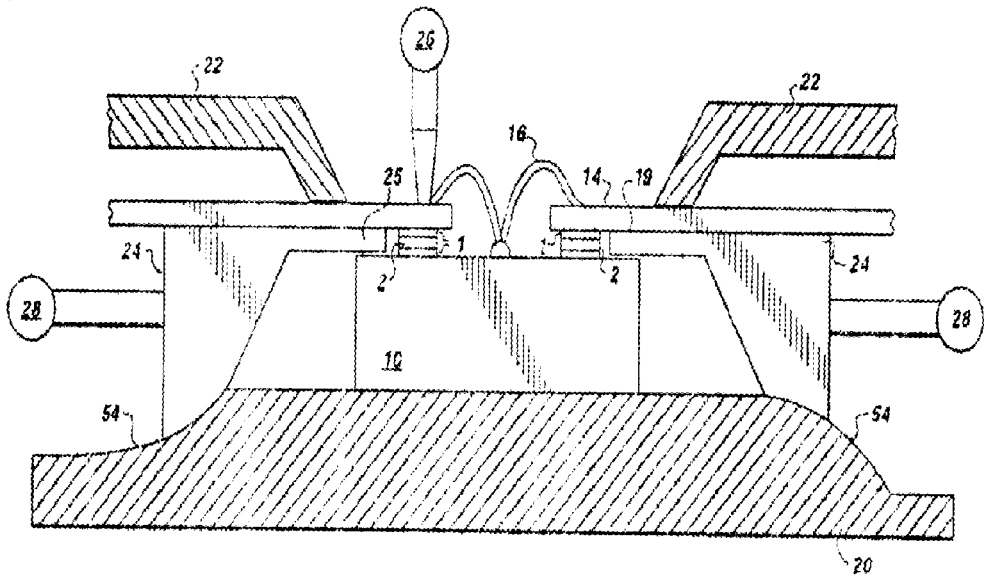

Fig. 17

UNITED STATES PATENT AND TRADEMARK OFFICE
CERTIFICATE OF CORRECTION

| | |
|---|---|
| PATENT NO. | : 6,267,287 B1 |
| APPLICATION NO. | : 09/358309 |
| DATED | : July 31, 2001 |
| INVENTOR(S) | : Michael B. Ball |

It is certified that error appears in the above-identified patent and that said Letters Patent is hereby corrected as shown below:

In the drawings: (continued)
    In FIG. 28,    delete reference numeral "1" and lead line therefor (as shown below)

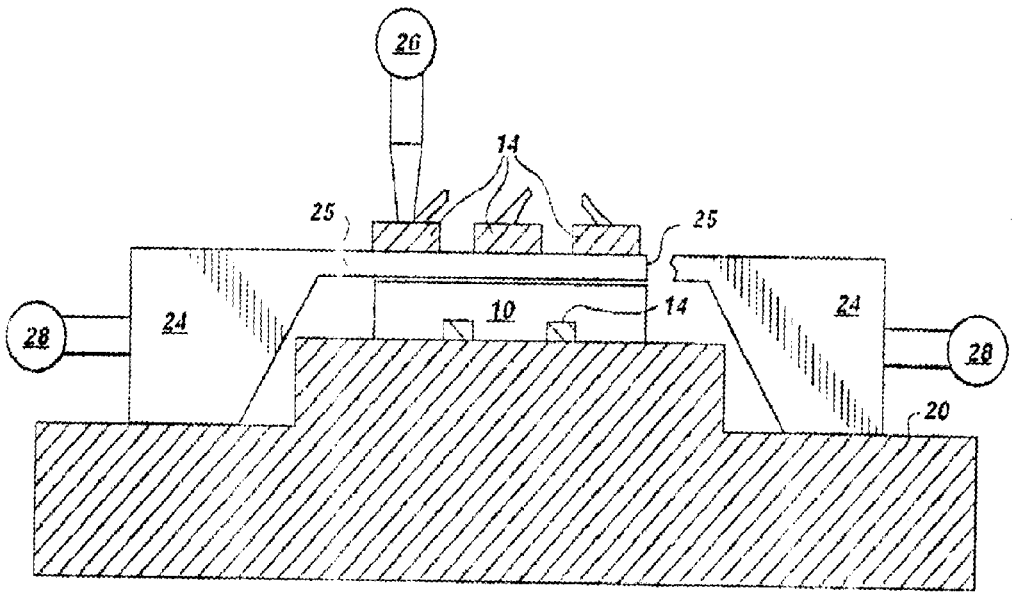

Fig. 28

In the specification:

| | |
|---|---|
| COLUMN 1, LINE 12, | change "Jun. 7, 1996," to --Jun. 17, 1996,-- |
| COLUMN 2, LINE 36, | change "die as apposed to" --die, as opposed to-- |
| COLUMN 5, LINE 59, | change "end thereof 17" to --end 17 thereof-- |

UNITED STATES PATENT AND TRADEMARK OFFICE
CERTIFICATE OF CORRECTION

| | |
|---|---|
| PATENT NO. | : 6,267,287 B1 |
| APPLICATION NO. | : 09/358309 |
| DATED | : July 31, 2001 |
| INVENTOR(S) | : Michael B. Ball |

It is certified that error appears in the above-identified patent and that said Letters Patent is hereby corrected as shown below:

In the specification: (continued)

| | |
|---|---|
| COLUMN 6, LINE 5, | change "clamp 22" to --conventional clamp 22-- |
| COLUMN 6, LINE 22, | change "block 20" to --heat block 20-- |
| COLUMN 7, LINE 27, | change "extending" to --extends-- |
| COLUMN 7, LINE 39, | change "for a wire" to --for a-- |
| COLUMN 7, LINE 46, | change "plate 64" to --resilient plate 64-- |
| COLUMN 7, LINE 48, | change "clamp 22" to --conventional clamp 22-- |
| COLUMN 7, LINE 50, | change "clamp 62" to --secondary clamp 62-- |
| COLUMN 7, LINE 51, | change "clamp 22" to --conventional clamp 22-- |
| COLUMN 7, LINE 53, | change "clamp 22." to --conventional clamp 22.-- |
| COLUMN 8, LINES 10-11, | change "a peripheral lead finger contact lip 65" to --the bond site window contact lip 65-- |
| COLUMN 8, LINE 22, | change "The independent" to --The conventional-- |
| COLUMN 8, LINE 23, | change "insure" to --ensure-- |
| COLUMN 8, LINE 29, | change "fixed clamp 22," to --conventional clamp 22,-- |
| COLUMN 8, LINE 30, | change "insures" to --ensures-- |
| COLUMN 8, LINE 35, | change "conventional fixed clamp 22," to --conventional clamp 22,-- |
| COLUMN 8, LINE 42, | change "thereof The independent" to --thereof. The independent-- |
| COLUMN 8, LINE 65, | change "insure" to --ensure-- |
| COLUMN 9, LINE 3, | change "wire bond 18" to --wire end 18-- |
| COLUMN 9, LINES 41-42, | change "lead penetrating" to --lead finger penetrating-- |
| COLUMN 9, LINE 46, | change "lead penetrating" to --lead finger penetrating-- |

UNITED STATES PATENT AND TRADEMARK OFFICE
CERTIFICATE OF CORRECTION

| | |
|---|---|
| PATENT NO. | : 6,267,287 B1 |
| APPLICATION NO. | : 09/358309 |
| DATED | : July 31, 2001 |
| INVENTOR(S) | : Michael B. Ball |

It is certified that error appears in the above-identified patent and that said Letters Patent is hereby corrected as shown below:

In the specification (continued)

| | |
|---|---|
| COLUMN 9, LINE 51, | change "lead penetrating" to --lead finger penetrating-- |
| COLUMN 9, LINE 55, | change "lead penetrating" to --lead finger penetrating-- |
| COLUMN 9, LINE 61, | change "lead penetrating" to --lead finger penetrating-- |
| COLUMN 9, LINE 65, | change "lead penetrating" to --lead finger penetrating-- |
| COLUMN 10, LINE 8, | change "insure" to --ensure-- |
| COLUMN 10, LINE 16, | change "fixed clamp 22," to --conventional clamp 22,-- |
| COLUMN 10, LINE 18, | change "insures" to --ensures-- |
| COLUMN 10, LINE 32, | change "insure" to --ensure-- |
| COLUMN 10, LINE 43, | change "fixed clamps 22" to --conventional clamps 22-- |
| COLUMN 10, LINE 46, | change "fixed clamp 22" to --conventional clamp 22-- |
| COLUMN 10, LINE 48, | change "insures" to --ensures-- |
| COLUMN 10, LINE 54, | change "lead penetrating" to --lead finger penetrating-- |
| COLUMN 11, LINE 3, | change "The penetrat-" to --The lead finger penetrat--- |
| COLUMN 11, LINE 9, | change "the penetrating" to --the lead finger penetrating-- |
| COLUMN 11, LINE 15, | change "the clamp 22." to --the conventional clamp 22.-- |
| COLUMN 11, LINE 34, | change "end thereof 17" to --end 17 thereof-- |
| COLUMN 11, LINE 60, | change "insure" to --ensure-- |
| COLUMN 12, LINE 60, | change "a window" to --a bond site window-- |
| COLUMN 13, LINE 3, | change "insure" to --ensure-- |
| COLUMN 13, LINE 9, | change "fixed clamp 22," to --the conventional clamp 22,-- |
| COLUMN 13, LINE 11, | change "insures" to --ensures-- |

UNITED STATES PATENT AND TRADEMARK OFFICE
CERTIFICATE OF CORRECTION

PATENT NO.       : 6,267,287 B1
APPLICATION NO.  : 09/358309
DATED            : July 31, 2001
INVENTOR(S)      : Michael B. Ball It is certified that error appears in the above-identified patent and that said Letters Patent is hereby corrected as shown below:

In the specification (continued)

| | |
|---|---|
| COLUMN 13, LINE 20, | change "having penetrating" to --having lead finger penetrating-- |
| COLUMN 13, LINE 33, | change "end thereof 17" to --end 17 thereof-- |
| COLUMN 13, LINE 42, | change "clamp 22" to --conventional clamp 22-- |
| COLUMN 13, LINE 52, | change "clamp 22." to --conventional clamp 22.-- |
| COLUMN 13, LINE 57, | change "insures" to --ensures-- |
| COLUMN 13, LINE 63, | change "adhesive 1" to --adhesive coatings 1-- |
| COLUMN 14, LINE 14, | change "lead support portion" to --lead support portion 25-- |
| COLUMN 14, LINE 22, | change "support portion" to --lead support 25-- and change "movable arm" to --movable arm 24-- |
| COLUMN 14, LINE 46, | change "plate 64" to --resilient plate 64-- |
| COLUMN 14, LINE 59, | change "clamp 22" to --conventional clamp 22-- |
| COLUMN 15, LINES 10-11, | change "peripheral lead finger" to --bond site window-- |
| COLUMN 15, LINE 12, | change "clamp 22." to --conventional clamp 22.-- |
| COLUMN 15, LINE 17, | change "lead clamp is" to --lead clamp 70 is-- and change "movable arms" to --movable arms 24-- |
| COLUMN 15, LINE 23, | change "independent clamp" to --conventional clamp-- |
| COLUMN 15, LINE 25, | change "insure" to --ensure-- |
| COLUMN 15, LINE 32, | change "insures" to --ensures-- |
| COLUMN 15, LINE 40, | change "independent clamps" to --independent actuated lead clamps-- |
| COLUMN 15, LINE 41, | change "penetrating" to --lead finger penetrating-- |
| COLUMN 15, LINE 43, | change "independent clamp" to --independent actuated lead clamp-- |

UNITED STATES PATENT AND TRADEMARK OFFICE
CERTIFICATE OF CORRECTION

PATENT NO. : 6,267,287 B1
APPLICATION NO. : 09/358309
DATED : July 31, 2001
INVENTOR(S) : Michael B. Ball It is certified that error appears in the above-identified patent and that said Letters Patent is hereby corrected as shown below:

In the specification (continued)

| | |
|---|---|
| COLUMN 15, LINE 46, | change "conventional fixed clamp" to --conventional clamp-- |
| COLUMN 15, LINE 47, | change "independent clamp" to --independent actuated lead clamp-- and change "having lead" to --having actuated lead finger-- |
| COLUMN 15, LINE 52, | change "chip" to --device-- |
| COLUMN 15, LINE 57, | change "end thereof 17" to --end 17 thereof-- |
| COLUMN 15, LINE 66, | change "clamp 22" to --conventional clamp 22-- |
| COLUMN 16, LINE 13, | change "insures" to --ensures-- |
| COLUMN 16, LINE 35, | change "portion is" to --portion 25 is-- |
| COLUMN 16, LINE 43, | change "portion and" to --portion 25 and-- |
| COLUMN 16, LINE 44, | change "arm are" to --arm 24 are-- |
| COLUMN 16, LINE 48, | change "FIG. 24," to --FIG. 23,-- |
| COLUMN 17, LINE 27, | change "plurality of bond wires" to --plurality of wires-- |
| COLUMN 17, LINES 30-31, | change "peripheral lead finger" to --bond site window-- |
| COLUMN 17, LINE 40, | change "independent" to --conventional-- |
| COLUMN 17, LINE 54, | change "clamp 70" to --actuated lead clamp 70-- |
| COLUMN 17, LINE 57, | change "independent clamp" to --independent actuated lead clamp-- |
| COLUMN 17, LINE 61, | change "clamps 70" to --actuated lead clamps 70-- |
| COLUMN 17, LINE 64, | change "clamp 70" to --actuated lead clamp 70-- |
| COLUMN 18, LINE 9, | change "independent lead" to --independent actuated lead-- |
| COLUMN 18, LINE 11, | change "clamp 70" to --independent actuated lead clamp 70-- |
| COLUMN 18, LINE 18, | change "independent clamp" to --independent actuated lead clamp-- |

UNITED STATES PATENT AND TRADEMARK OFFICE
CERTIFICATE OF CORRECTION

PATENT NO. : 6,267,287 B1
APPLICATION NO. : 09/358309
DATED : July 31, 2001
INVENTOR(S) : Michael B. Ball It is certified that error appears in the above-identified patent and that said Letters Patent is hereby corrected as shown below:

In the specification (continued)

| | |
|---|---|
| COLUMN 18, LINE 26 | change "independent clamp" to --independent actuated lead clamp-- |
| COLUMN 18, LINE 30, | change "clamp 70" to --independent actuated lead clamp 70-- |
| COLUMN 18, LINE 39, | change "clamps 70" to --independent actuated lead clamps 70-- and change "having penetrating" to --having lead finger penetrating-- |
| COLUMN 18, LINE 42, | change "independent clamp 70" to --independent actuated lead clamp 70-- and change "lead penetrating" to --lead finger penetrating-- |
| COLUMN 18, LINE 45, | change "conventional fixed" to --conventional-- |
| COLUMN 18, LINE 46, | change "independent clamp 70" to --independent actuated lead clamp 70-- and change "lead penetrating" to --lead finger penetrating-- |
| COLUMN 18, LINE 51, | change "independent clamp 70" to --independent actuated lead clamp 70-- and change "lead penetrating" to --lead finger penetrating-- |
| COLUMN 18, LINE 55, | change "independent clamp70" to --independent actuated lead clamp 70-- and change "lead penetrating" to --lead finger penetrating-- |
| COLUMN 19, LINE 1, | change "independent clamps 70" to --independent actuated lead clamps 70-- |
| COLUMN 19, LINE 4, | change "independently actuated lead clamp" to --independent actuated lead clamp 70-- |
| COLUMN 19, LINE 8, | change "independent clamp 70" to --independent actuated lead clamp 70-- and change "insure" to --ensure-- |

UNITED STATES PATENT AND TRADEMARK OFFICE
CERTIFICATE OF CORRECTION

PATENT NO.        : 6,267,287 B1
APPLICATION NO.   : 09/358309
DATED             : July 31, 2001
INVENTOR(S)       : Michael B. Ball It is certified that error appears in the above-identified patent and that said Letters Patent is hereby corrected as shown below:

In the specification (continued):

| | |
|---|---|
| COLUMN 19, LINE 10, | change "insures" to --ensures-- |
| COLUMN 19, LINE 14, | change "independent clamp 70," to --independent actuated lead clamp 70,-- |
| COLUMN 19, LINE 15, | change "fixed clamp 22," to --conventioanl clamp 22,-- |
| COLUMN 19, LINE 17, | change "insures" to --ensures-- |
| COLUMN 19, LINE 25, | change "clamps 70" to --actuated lead clamps 70-- |
| COLUMN 19, LINE 28, | change "independent clamp 70" to --independent actuated lead clamp 70-- |
| COLUMN 19, LINE 30, | change "insure" to --ensure-- |
| COLUMN 19, LINE 32, | change "independent clamps 70" to --independent actuated lead clamps 70-- |
| COLUMN 19, LINE 45, | change "fixed clamp" to --conventional clamp-- |
| COLUMN 19, LINE 47, | change "insures" to --ensures-- |
| COLUMN 19, LINE 50, | change "portions thereon" to --portions 78 thereon-- |
| COLUMN 19, LINE 53, | change "lead penetrating" to --lead finger penetrating-- |
| COLUMN 19, LINE 56, | change "independent lead clamp 70" to --independent actuated lead clamp 70-- |
| COLUMN 19, LINE 58, | change "clamp 70" to --independent actuated lead clamp 70-- |
| COLUMN 19, LINE 62, | change "lead clamp 22" to --conventional clamp 22-- |
| COLUMN 20, LINE 9, | after "movable arm 24" insert --(not shown)-- |
| COLUMN 20, LINE 13, | change "end thereof 17" to --end 17 thereof-- |
| COLUMN 20, LINE 49, | change "wire bonding apparatus" to --bonding apparatus-- |
| COLUMN 21, LINE 16, | change "fixed clamp" to --conventional clamp-- |

UNITED STATES PATENT AND TRADEMARK OFFICE
CERTIFICATE OF CORRECTION

PATENT NO.       : 6,267,287 B1
APPLICATION NO.  : 09/358309
DATED            : July 31, 2001
INVENTOR(S)      : Michael B. Ball It is certified that error appears in the above-identified patent and that said Letters Patent is hereby corrected as shown below:

In the specification (continued):

| | |
|---|---|
| COLUMN 21, LINE 17, | change "independent clamp 70" to --independent actuated lead clamp 70-- |
| COLUMN 21, LINE 18, | change "independent clamp 70" to --independent actuated lead clamp 70-- |
| COLUMN 21, LINE 23, | change "fixed clamp" to --conventional clamp-- |
| COLUMN 21, LINE 24, | change "independent clamp 70" to --independent actuated lead clamp 70-- |
| COLUMN 21, LINE 26, | change "independent clamp 70" to --independent actuated lead clamp 70-- |

In the claims:

| | |
|---|---|
| CLAIM 1, COLUMN 22, LINE 46, | change "least on lead finger" to --least one lead finger-- |
| CLAIM 1, COLUMN 22, LINE 50, | change "of at least one of said lead fingers" to --of said at least one lead finger-- |
| CLAIM 2, COLUMN 22, LINE 58, | change "one of said lead fingers" to --one lead finger-- |
| CLAIM 11, COLUMN 23, LINE 36, | change "least on lead finger" to --least one lead finger-- |
| CLAIM 11, COLUMN 23, LINES 39-40, | change "of at least one of said lead fingers" to --of said at least one lead finger-- |
| CLAIM 12, COLUMN 24, LINE 4, | change "of at least one of said lead fingers" to --of said at least one lead finger-- |

UNITED STATES PATENT AND TRADEMARK OFFICE
CERTIFICATE OF CORRECTION

PATENT NO. : 6,267,287 B1
APPLICATION NO. : 09/358309
DATED : July 31, 2001
INVENTOR(S) : Michael B. Ball It is certified that error appears in the above-identified patent and that said Letters Patent is hereby corrected as shown below:

In the claims (continued):
CLAIM 13, COLUMN 24, LINE 9, change "of said lead fingers" to --lead finger--

CLAIM 19, COLUMN 24, LINE 29, change "clamp configured" --clamp is configured--

Signed and Sealed this

Fifteenth Day of January, 2008

JON W. DUDAS
*Director of the United States Patent and Trademark Office*